(12) United States Patent
Kadota et al.

(10) Patent No.: US 12,081,188 B2
(45) Date of Patent: Sep. 3, 2024

(54) ACOUSTIC WAVE DEVICES

(71) Applicant: TOHOKU UNIVERSITY, Sendai (JP)

(72) Inventors: Michio Kadota, Sendai (JP); Shuji Tanaka, Sendai (JP); Yoshimi Ishii, Sendai (JP)

(73) Assignee: Skyworks Solutions, Inc., Irvine, CA (US)

( * ) Notice: Subject to any disclaimer, the term of this patent is extended or adjusted under 35 U.S.C. 154(b) by 817 days.

(21) Appl. No.: 16/653,964

(22) Filed: Oct. 15, 2019

(65) Prior Publication Data

US 2020/0119710 A1 Apr. 16, 2020

Related U.S. Application Data

(60) Provisional application No. 62/746,512, filed on Oct. 16, 2018.

(51) Int. Cl.
*H03H 9/02* (2006.01)
*H03H 3/08* (2006.01)
*H03H 9/145* (2006.01)
*H03H 9/25* (2006.01)
*H03H 9/64* (2006.01)

(52) U.S. Cl.
CPC .......... *H03H 9/02551* (2013.01); *H03H 3/08* (2013.01); *H03H 9/02574* (2013.01); *H03H 9/145* (2013.01); *H03H 9/25* (2013.01); *H03H 9/64* (2013.01)

(58) Field of Classification Search
CPC ............... H03H 9/02; H03H 9/25; H03H 9/64
See application file for complete search history.

(56) References Cited

U.S. PATENT DOCUMENTS 8,572,825 B2 * 11/2013 Hayakawa ............... C30B 31/20
156/247
10,211,389 B2 * 2/2019 Tai ........................ H10N 30/072
(Continued)

FOREIGN PATENT DOCUMENTS

CN 102361061 A 2/2012
CN 105409119 A 3/2016
(Continued)

OTHER PUBLICATIONS

International Search Report dated Apr. 8, 2020 for PCT/US2019/056348.
Written Opinion dated Apr. 8, 2020 for PCT/US2019/056348.

*Primary Examiner* — Andrea Lindgren Baltzell
*Assistant Examiner* — Alan Wong
(74) *Attorney, Agent, or Firm* — Chang & Hale LLP

(57) ABSTRACT

Acoustic wave devices and related methods are disclosed. In some embodiments, an acoustic wave device can include a quartz substrate having a first surface, and a piezoelectric plate formed from LiTaO3 or LiNbO3 and having a first surface configured to support a surface acoustic wave and a second surface in engagement with the first surface of the quartz substrate. The second surface of the piezoelectric plate is a minus surface resulting from crystal structure orientation of the piezoelectric plate. The acoustic wave device can further include an interdigital transducer electrode formed on the first surface of the piezoelectric plate and configured to provide transducer functionality associated with the surface acoustic wave.

20 Claims, 28 Drawing Sheets

(56) References Cited

U.S. PATENT DOCUMENTS

| | | | |
|---|---|---|---|
| 10,778,181 B2* | 9/2020 | Goto | H03H 9/02834 |
| 10,862,455 B2* | 12/2020 | Takai | H03H 9/02559 |
| 11,206,007 B2* | 12/2021 | Inoue | H03H 9/02574 |
| 2011/0041987 A1 | 2/2011 | Hori et al. | |
| 2011/0120843 A1 | 5/2011 | Wunnicke et al. | |
| 2011/0220275 A1 | 9/2011 | Hayakawa et al. | |
| 2015/0007424 A1 | 1/2015 | Iwamoto | |
| 2015/0008789 A1 | 1/2015 | Iwamoto | |
| 2016/0133823 A1 | 5/2016 | Tai et al. | |
| 2016/0182008 A1 | 6/2016 | Bhattacharjee | |
| 2017/0033764 A1 | 2/2017 | Inoue et al. | |
| 2017/0062698 A1 | 3/2017 | Ito et al. | |
| 2017/0222622 A1 | 8/2017 | Solar et al. | |
| 2018/0048283 A1 | 2/2018 | Tanno et al. | |
| 2019/0267966 A1* | 8/2019 | Hiratsuka | H03H 9/15 |
| 2019/0319603 A1 | 10/2019 | Kadota et al. | |
| 2020/0119710 A1 | 4/2020 | Kadota et al. | |
| 2020/0144981 A1 | 5/2020 | Knapp et al. | |
| 2021/0020826 A1 | 1/2021 | Belhachemi et al. | |
| 2021/0111688 A1* | 4/2021 | Abbott | H03H 9/14541 |
| 2022/0029599 A1* | 1/2022 | Iwamoto | H03H 9/25 |
| 2022/0173720 A1* | 6/2022 | Kadota | H03H 9/14538 |

FOREIGN PATENT DOCUMENTS

| | | |
|---|---|---|
| EP | 0206944 A2 | 12/1986 |
| EP | 0762640 A1 | 3/1997 |
| JP | H09-214282 A | 8/1997 |
| JP | 2001-332958 A | 11/2001 |
| JP | 2003-142984 A | 5/2003 |
| JP | 2006-042008 A | 2/2006 |
| JP | 2006-246050 A | 9/2006 |
| JP | 2012005106 A | 1/2012 |
| WO | 2000/067374 A1 | 11/2000 |
| WO | 2005/034347 A1 | 4/2005 |
| WO | 2005/083881 A1 | 9/2005 |
| WO | 2010067794 A1 | 6/2010 |
| WO | 2015012005 A1 | 1/2015 |
| WO | 2017013968 A1 | 1/2017 |
| WO | 2018-097016 A1 | 5/2018 |
| WO | 2021006056 A1 | 1/2021 |

* cited by examiner

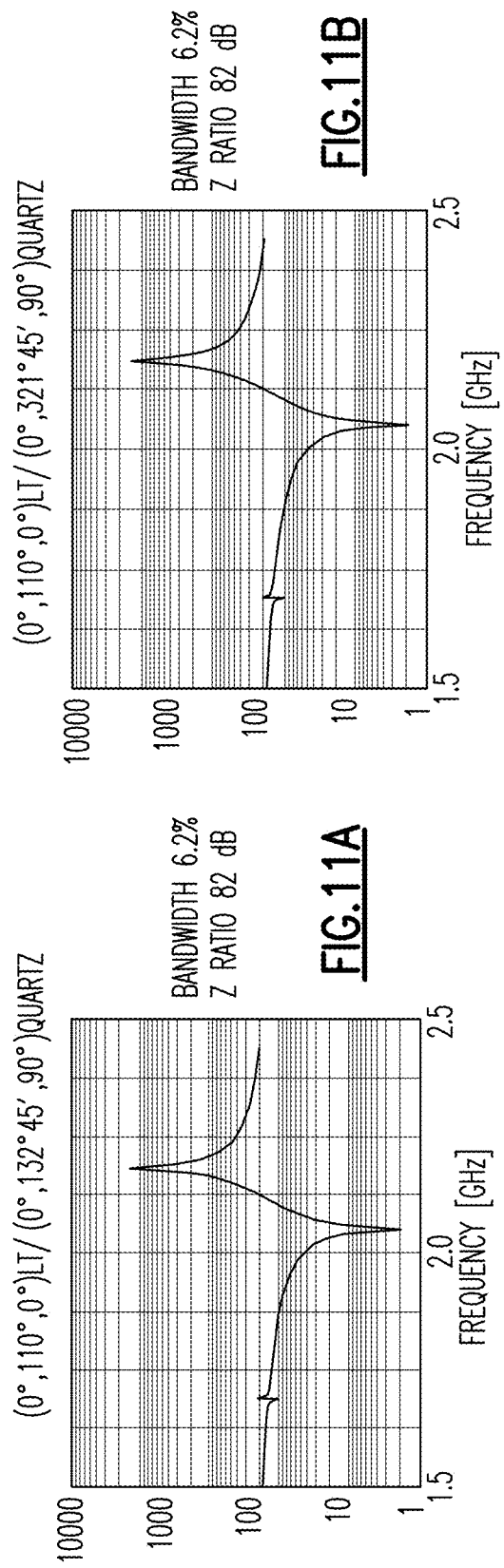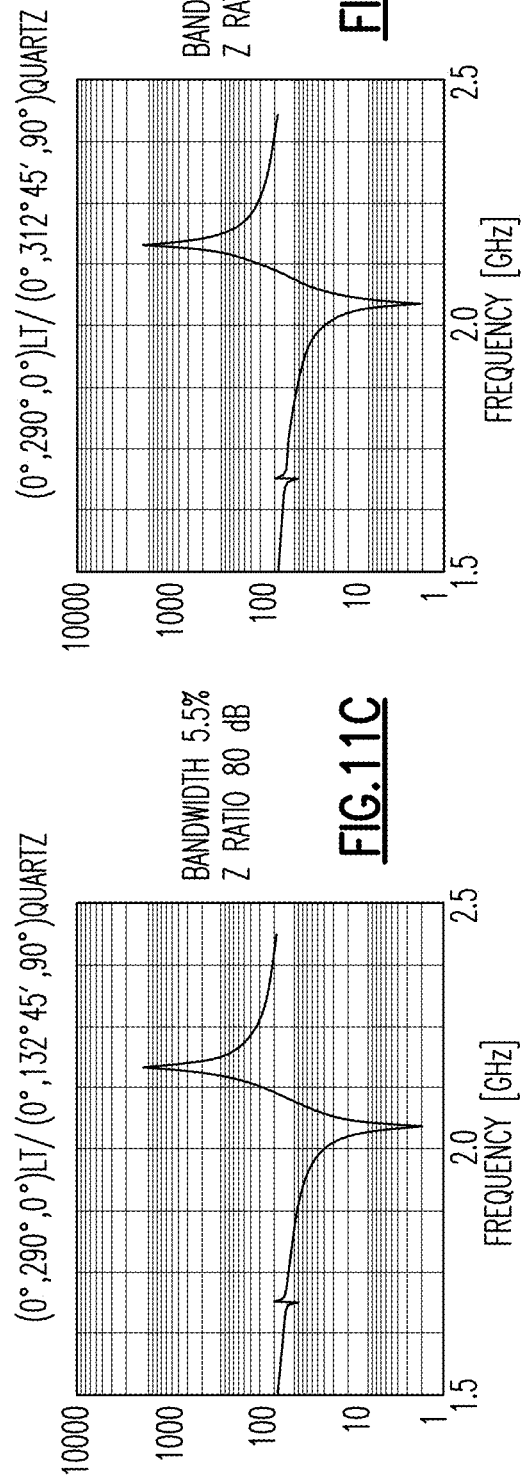
FIG.11A  FIG.11B  FIG.11C  FIG.11D

PEELED PORTION

ACOUSTIC WAVE DEVICES

CROSS-REFERENCE TO RELATED APPLICATION(S)

This application claims priority to U.S. Provisional Application No. 62/746,512 filed Oct. 16, 2018, entitled ACOUSTIC WAVE DEVICES, the disclosure of which is hereby expressly incorporated by reference herein in its entirety.

BACKGROUND

Field

The present disclosure relates to acoustic wave devices such as surface acoustic wave (SAW) devices.

Description of the Related Art

A surface acoustic wave (SAW) resonator typically includes an interdigital transducer (IDT) electrode implemented on a surface of a piezoelectric layer. Such an electrode includes two interdigitized sets of fingers, and in such a configuration, the distance between two neighboring fingers of the same set is approximately the same as the wavelength $\lambda$ of a surface acoustic wave supported by the IDT electrode.

In many applications, the foregoing SAW resonator can be utilized as a radio-frequency (RF) filter based on the wavelength $\lambda$. Such a filter can provide a number of desirable features.

SUMMARY

In accordance with some implementations, the present disclosure relates to an acoustic wave device that includes a quartz substrate having a first surface, and a piezoelectric plate formed from $LiTaO_3$ or $LiNbO_3$ and including a first surface configured to support a surface acoustic wave and a second surface in engagement with the first surface of the quartz substrate. The second surface is a minus surface resulting from crystal structure orientation of the piezoelectric plate. The acoustic wave device further includes an interdigital transducer electrode formed on the first surface of the piezoelectric plate and configured to provide transducer functionality associated with the surface acoustic wave.

In some embodiments, the crystal structure orientation of the piezoelectric plate can include Euler angles (0°, 90°<θ<270°, 0°). In some embodiments, the first surface of the quartz substrate can be a plus surface resulting from crystal structure orientation of the quartz substrate. The crystal structure orientation of the quartz substrate can include Euler angles (φ, 90°<θ<270°, ψ), with the angle φ having a value in a range of 0°≤φ<180°, and the angle ψ having a value in a range of 0°≤ψ<180°. The angle φ can have a value of, for example, 0°. The angle ψ can have a value of, for example, 0°.

In some embodiments, the first surface of the quartz substrate can be a minus surface resulting from crystal structure orientation of the quartz substrate. The crystal structure orientation of the quartz substrate can include Euler angles (φ, −90°<θ<90°, ψ), with the angle φ having a value in a range of 0°≤φ<180°, and the angle ψ having a value in a range of 0°≤ψ<180°. The angle φ can have a value of, for example, 0°. The angle ψ can have a value of, for example, 0°.

In some embodiments, the first surface of the quartz substrate can be an unpolarized surface resulting from crystal structure orientation of the quartz substrate. The crystal structure orientation of the quartz substrate can include Euler angles (φ, 90°, ψ) or (φ, −90°, ψ), with the angle φ having a value in a range of 0°≤φ<180°, and the angle ψ having a value in a range of 0°≤ψ<180°. The angle φ can have a value of, for example, 90°, and the angle ψ can have a value of, for example, 90°.

In some embodiments, the piezoelectric plate can be formed from $LiTaO_3$ and the quartz substrate can include Euler angles (0°, 10°-80°, 0°), (0°, 100°-170°, 0°), (0°, 190°-260°, 0°) or (0°, 280°-350°, 0°).

In some embodiments, the piezoelectric plate can be formed from $LiNbO_3$ and the quartz substrate can include Euler angles (0°, 5°-85°, 0°), (0°, 95°-175°, 0°), (0°, 185°-265°, 0°) or (0°, 275°-355°, 0°).

In some embodiments, the piezoelectric plate can be formed from $LiTaO_3$ and the quartz substrate can include Euler angles (0°, 5°-53°, 90°), (0°, 127°-175°, 90°), (0°, 185°-233°, 90°) or (0°, 307°-355°, 90°).

In some embodiments, the piezoelectric plate can be formed from $LiNbO_3$ and the quartz substrate can include Euler angles (0°, 0°-52°, 90°), (0°, 126°-180°, 90°), (0°, 180°-232°, 90°) or (0°, 306°-360°, 90°).

In some embodiments, the piezoelectric plate can be formed from $LiTaO_3$ or $LiNbO_3$ and the quartz substrate can include Euler angles (0°, 0°-360°, 0°-60°) or (0°, 0°-360°, 120°-180°). In some embodiments, the piezoelectric plate can be formed from $LiTaO_3$ or $LiNbO_3$ and the quartz substrate can include Euler angles (0°, 0°-360°, 0°-45°) or (0°, 0°-360°, 135°-180°).

In some embodiments, the acoustic wave device can further include first and second reflectors implemented on the first surface of the piezoelectric plate and positioned on first and second sides of the interdigital transducer electrode.

In some embodiments, thickness of the piezoelectric plate can be in a range of 0.04λ to 1.5λ, with the quantity λ being wavelength of the surface acoustic wave. In some embodiments, the thickness of the piezoelectric plate can be in a range of 0.06λ to 1.0λ.

In some teachings, the present disclosure relates to a method for fabricating an acoustic wave device. The method includes forming or providing a quartz substrate having a first surface. The method further includes forming or providing a piezoelectric plate with $LiTaO_3$ or $LiNbO_3$ to include a first surface configured to support a surface acoustic wave and a second surface being a minus surface resulting from crystal structure orientation of the piezoelectric plate. The method further includes coupling the piezoelectric plate with the quartz substrate such that the minus surface of the piezoelectric plate engages the first surface of the quartz substrate.

In some embodiments, the method can further include forming an interdigital transducer electrode on the first surface of the piezoelectric plate to provide transducer functionality associated with the surface acoustic wave.

In some embodiments, the crystal structure orientation of the piezoelectric plate can include Euler angles (0°, 90°<θ<270°, 0°). In some embodiments, the first surface of the quartz substrate can be a plus surface, a minus surface or an unpolarized surface resulting from crystal structure orientation of the quartz substrate.

In some embodiments, the first surface of the quartz substrate can be a plus surface, and the quartz substrate can include Euler angles (φ, 90°<θ<270°, ψ); be a minus surface, and the quartz substrate can include Euler angles (φ, −90°<θ<90°, ψ); or be an unpolarized surface, and the quartz substrate can include Euler angles (φ, 90°, ψ) or (φ, −90°, ψ). The angle φ can have a value in a range of 0°≤φ<180°, and the angle ψ can have a value in a range of 0°≤ψ<180°.

In some embodiments, the forming or providing of the piezoelectric plate can include forming the piezoelectric plate after the coupling of the piezoelectric plate with the quartz substrate. The coupling of the piezoelectric plate with the quartz substrate and the forming of the piezoelectric plate can include bonding a thick piezoelectric layer to the quartz substrate, followed by thinning the thick piezoelectric layer to result in the piezoelectric plate engaged to the quartz substrate. The thinning of the thick piezoelectric layer can include a polishing process.

In some embodiments, the forming or providing of the piezoelectric plate can include forming the piezoelectric plate before the coupling of the piezoelectric plate with the quartz substrate. The coupling of the piezoelectric plate with the quartz substrate and the forming of the piezoelectric plate can include attaching a thick piezoelectric layer to a handling substrate, followed by thinning the thick piezoelectric layer to form the minus surface of the piezoelectric plate, followed by bonding the minus surface of the piezoelectric plate to the quartz substrate. The coupling of the piezoelectric plate with the quartz substrate and the forming of the piezoelectric plate can further include removing the handling substrate to expose the first surface of the piezoelectric plate.

In some embodiments, the handling substrate can include a silicon substrate. In some embodiments, the attaching of the thick piezoelectric layer to the handling substrate can include bonding the thick piezoelectric layer to the handling substrate. In some embodiments, the thinning of the thick piezoelectric layer can include a polishing process while the thick piezoelectric layer is attached to the handling substrate. In some embodiments, the removing of the handling substrate can include an etching process.

In a number of implementations, the present disclosure relates to a radio-frequency filter that includes an input node for receiving a signal, and an output node for providing a filtered signal. The radio-frequency filter further includes an acoustic wave device implemented to be electrically between the input node and the output node to generate the filtered signal. The acoustic wave device includes a quartz substrate with a first surface, and a piezoelectric plate formed from LiTaO$_3$ or LiNbO$_3$ and having a first surface configured to support a surface acoustic wave and a second surface in engagement with the first surface of the quartz substrate. The second surface is a minus surface resulting from crystal structure orientation of the piezoelectric plate.

In some embodiments, the radio-frequency filter can further include first and second interdigital transducer electrodes formed on the first surface of the piezoelectric plate. The first interdigital transducer electrode can be electrically connected to the input node and the second interdigital transducer electrode can be electrically connected to the output node.

In some implementations, the present disclosure relates to a radio-frequency module that includes a packaging substrate configured to receive a plurality of components, and a radio-frequency circuit implemented on the packaging substrate and configured to support either or both of transmission and reception of signals. The radio-frequency module further includes a radio-frequency filter configured to provide filtering for at least some of the signals. The radio-frequency filter includes an acoustic wave device having a quartz substrate with a first surface, and a piezoelectric plate formed from LiTaO$_3$ or LiNbO$_3$ and having a first surface configured to support a surface acoustic wave and a second surface in engagement with the first surface of the quartz substrate. The second surface is a minus surface resulting from crystal structure orientation of the piezoelectric plate.

In some implementations, the present disclosure relates to a wireless device that includes a transceiver, an antenna, and a wireless system implemented to be electrically between the transceiver and the antenna. The wireless system includes a filter configured to provide filtering functionality for the wireless system. The filter includes an acoustic wave device having a quartz substrate with a first surface, and a piezoelectric plate formed from LiTaO$_3$ or LiNbO$_3$ and having a first surface configured to support a surface acoustic wave and a second surface in engagement with the first surface of the quartz substrate. The second surface is a minus surface resulting from crystal structure orientation of the piezoelectric plate.

In some teachings, the present disclosure relates to a method for fabricating an acoustic wave device. The method includes attaching a first surface of a piezoelectric layer to a handling substrate, and performing a thinning operation on the piezoelectric layer to expose a second surface of a reduced-thickness piezoelectric layer attached to the handling substrate. The method further includes bonding the second surface of the reduced-thickness piezoelectric layer to a first surface of a permanent substrate, and removing the handling substrate from the reduced-thickness piezoelectric layer.

In some embodiments, the removing of the handling substrate from the reduced-thickness piezoelectric layer can expose the first surface that was attached to the handling substrate, with the first surface being configured to support a surface acoustic wave. The method can further include forming an interdigital transducer electrode on the first surface of the reduced-thickness piezoelectric layer to provide transducer functionality associated with the surface acoustic wave.

In some embodiments, an assembly of the acoustic wave device and the respective interdigital transducer electrode can be one of an array of similar assemblies implemented as a wafer. The method can further include singulating the wafer to provide a plurality of acoustic wave devices.

In some embodiments, the handling substrate can include a silicon substrate. In some embodiments, the permanent substrate can include a quartz substrate.

In some embodiments, the piezoelectric layer can be formed from LiTaO$_3$ or LiNbO$_3$ with a crystal structure orientation such that the second surface of the reduced-thickness piezoelectric layer is a minus surface. The crystal structure orientation of the piezoelectric plate can include Euler angles (0°, 90°<θ<270°, 0°).

In some embodiments, the first surface of the permanent substrate can be a plus surface, a minus surface or an unpolarized surface resulting from crystal structure orientation of the permanent substrate. In some embodiments, the first surface of the permanent substrate can be a plus surface, and the permanent substrate can include Euler angles (φ, 90°<θ<270°, ψ); be a minus surface, and the permanent substrate can include Euler angles (φ, −90°<θ<90°, ψ); or be an unpolarized surface, and the permanent substrate can include Euler angles (φ, 90°, ψ) or (φ, −90°, ψ). The angle φ can have a value in a range of 0°≤φ<180°, and the angle ψ can have a value in a range of 0°≤ψ<180°.

In accordance with some implementations, the present disclosure relates to a wafer assembly that includes a piezoelectric layer having a first surface and a second surface. The wafer assembly further includes a handling substrate attached the first surface of the piezoelectric layer, and a permanent substrate attached to the second surface of the piezoelectric layer. The handling substrate is selected to be removable to expose the first surface of the piezoelectric layer while the piezoelectric layer is attached to the permanent substrate.

In some embodiments, the handling substrate can be a silicon substrate. In some embodiments, the permanent substrate can be a quartz substrate.

In some embodiments, the piezoelectric layer can be a reduced-thickness piezoelectric layer resulting from a thinning operation on a thick piezoelectric layer having its first surface attached to the handling wafer and without the permanent substrate. In some embodiments, the first surface of the piezoelectric layer can be bonded to the handling substrate with a first bond strength, and the second surface of the piezoelectric layer can be bonded to the permanent substrate with a second bond strength. The first bond strength between the piezoelectric layer and the handling substrate can be greater than the bond strength between the piezoelectric layer and the permanent substrate, with the first bond strength allowing the thinning operation to be performed without damage to the piezoelectric layer. For example, the first bond strength between the piezoelectric layer and the handling substrate can be greater than the second bond strength between the piezoelectric layer and the permanent substrate by at least an order of magnitude.

In some embodiments, the piezoelectric layer can be formed from LiTaO$_3$ or LiNbO$_3$ with a crystal structure orientation such that the second surface of the reduced-thickness piezoelectric layer is a minus surface. The crystal structure orientation of the piezoelectric plate can include Euler angles (0°, 90°<θ<270°, 0°).

In some embodiments, the first surface of the permanent substrate can be a plus surface, a minus surface or an unpolarized surface resulting from crystal structure orientation of the permanent substrate. In some embodiments, the first surface of the permanent substrate can be a plus surface, and the permanent substrate can include Euler angles (φ, 90°<θ<270°, ψ); be a minus surface, and the permanent substrate can include Euler angles (φ, −90°<θ<90°, ψ); or be an unpolarized surface, and the permanent substrate can include Euler angles (φ, 90°, ψ) or (φ, −90°, ψ). The angle φ can have a value in a range of 0°≤φ<180°, and the angle ψ can have a value in a range of 0°≤ψ<180°.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

The present disclosure relates to U.S. patent application Ser. No. 16/653,965, titled "METHODS AND ASSEMBLIES RELATED TO FABRICATION OF ACOUSTIC WAVE DEVICES," filed on even date herewith and hereby incorporated by reference herein in its entirety.

BRIEF DESCRIPTION OF THE DRAWINGS

FIGS. 11A-11D show frequency characteristics of four combinations of the (+) and (−) surfaces of a 20°-rotated Y-plate X-propagation LT with the (+) and (−) surfaces of a 42° 45'Y-plate 90° X-propagation quartz.

and the Y-direction (direction 90-degree angled to the SAW propagation direction) of a (0°, θ, 0°) LN.

Figure 18:
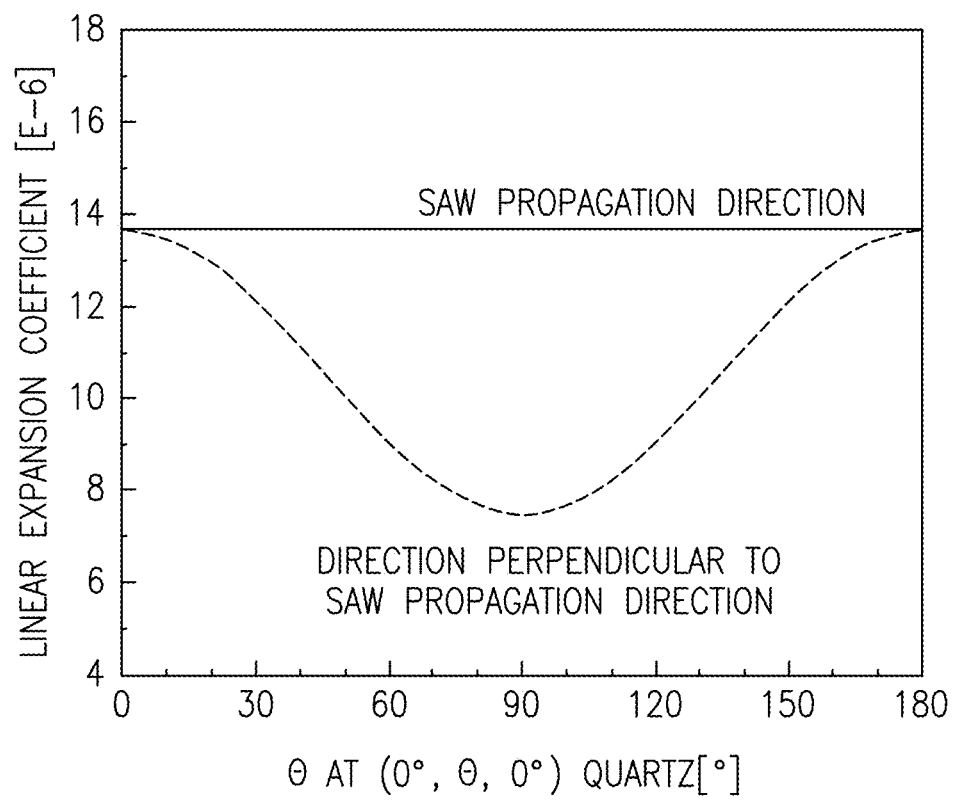

FIG. 18 shows a θ dependence of the linear expansion coefficients in the X-direction and the Y-direction of a (0°, θ, 0°) quartz.

Figure 19:
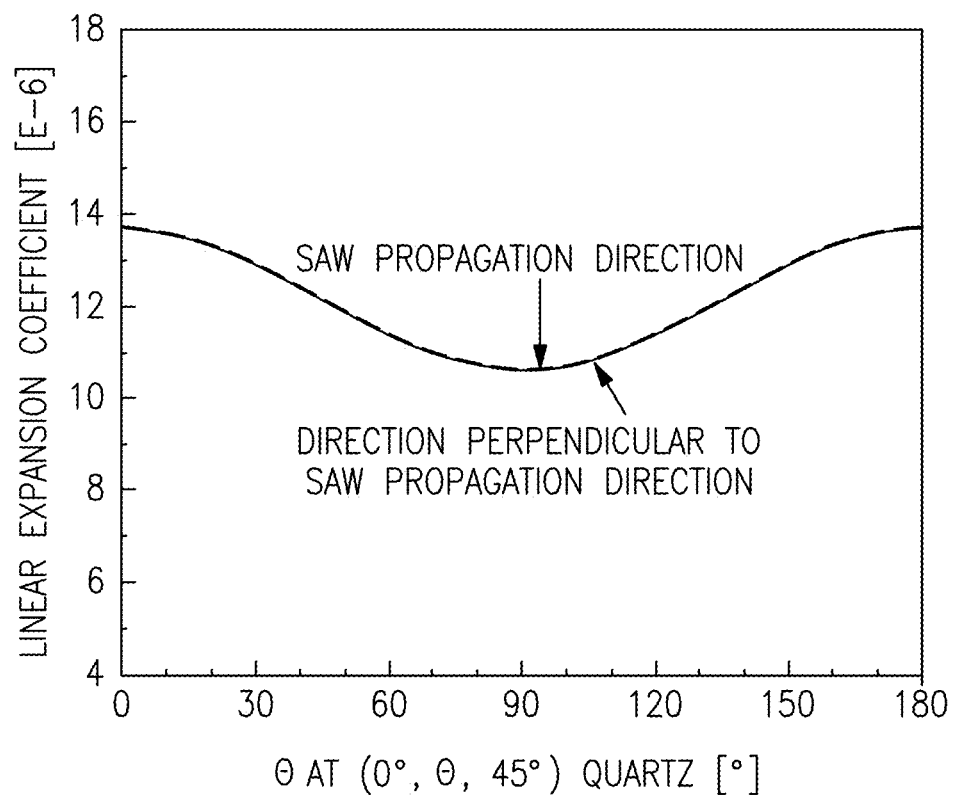

FIG. 19 shows a θ dependence of the linear expansion coefficients in the X-direction and the Y-direction of a (0°, θ, 45°) quartz.

Figure 20:
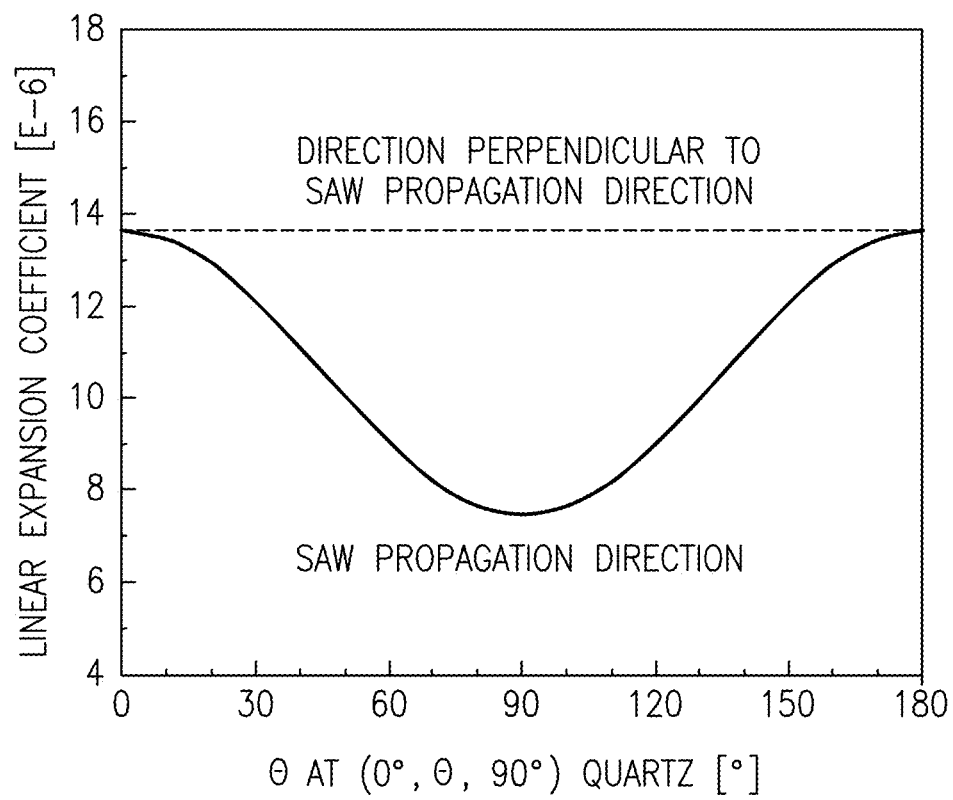

FIG. 20 shows a θ dependence of the linear expansion coefficients in the X-direction and the Y-direction of a (0°, θ, 90°) quartz.

Figure 21:
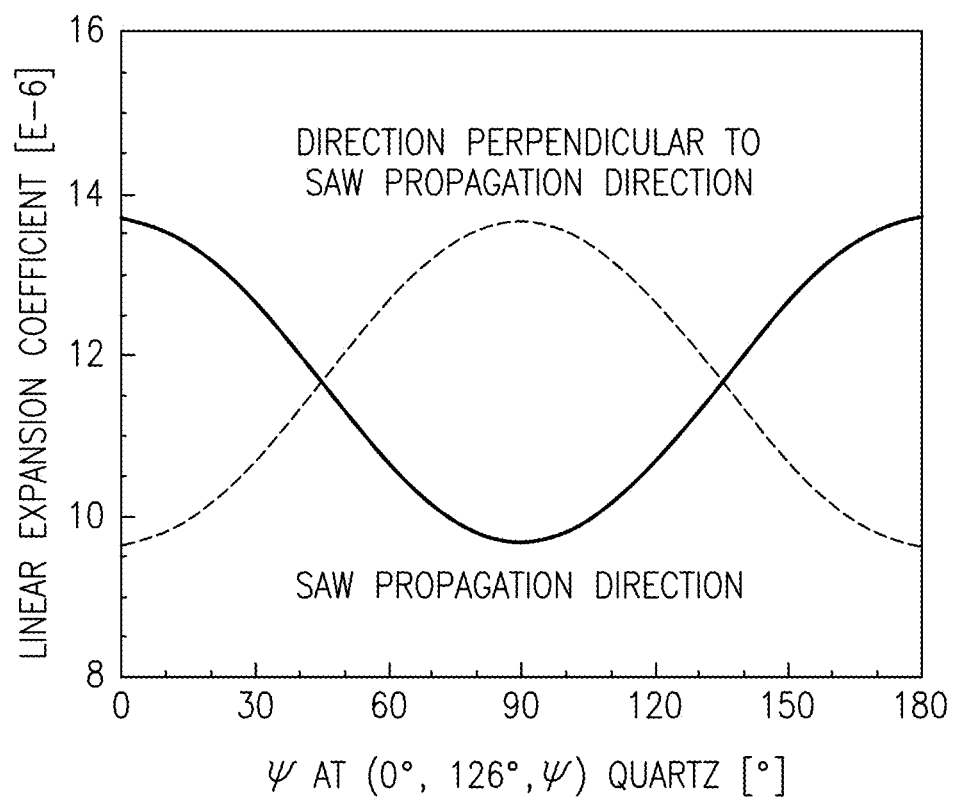

FIG. 21 shows a ψ dependence of the linear expansion coefficients in the X-direction and the Y-direction of a (0°, 126°, ψ) quartz.

Figure 22:
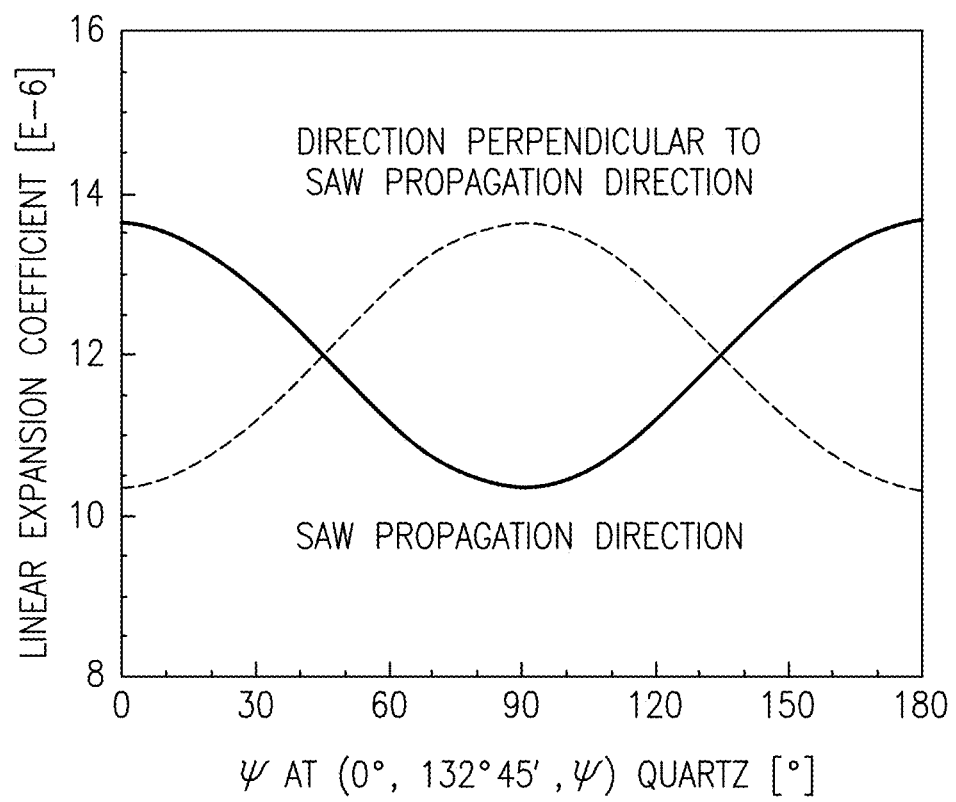

FIG. 22 shows a ψ dependence of the linear expansion coefficients in the X-direction and the Y-direction of a (0°, 132° 45', ψ) quartz.

Figure 23:
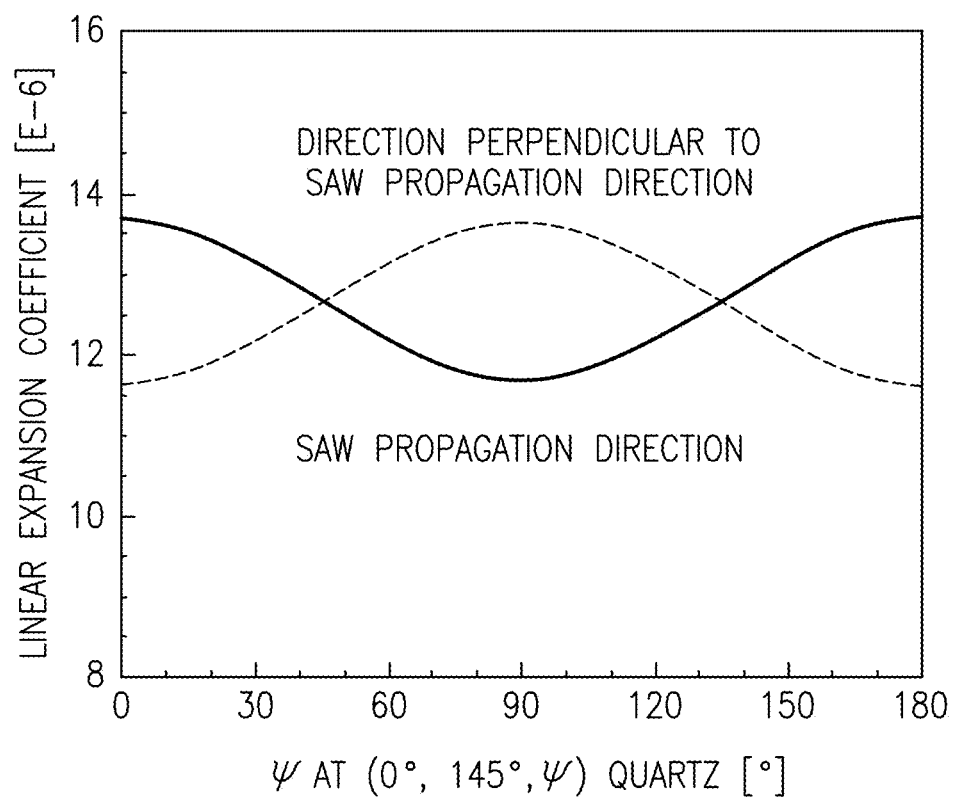

FIG. 23 shows a ψ dependence of the linear expansion coefficients in the X-direction and the Y-direction of a (0°, 145°, ψ) quartz.

Figure 24A:
Figure 24B:
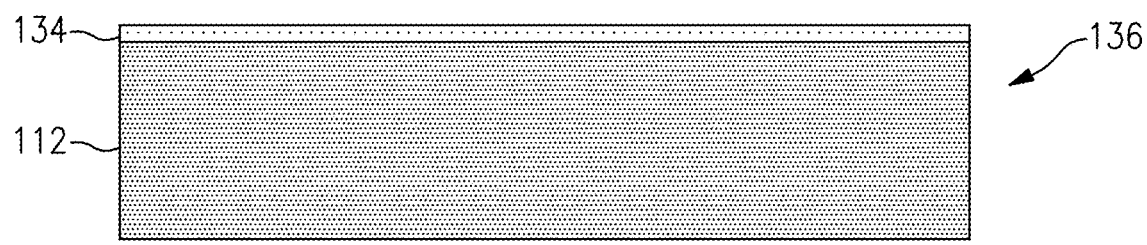
Figure 24C:
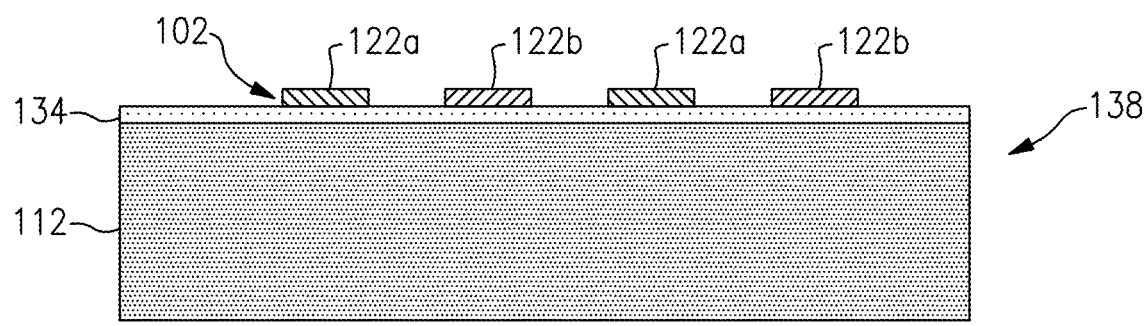

FIGS. 24A-24C show an example of a process that can be utilized to obtain a combination of an LT or LN plate and a quartz substrate.

FIGS. 25A-25E show another example of a process that can be utilized to obtain a combination of an LT or LN plate and a quartz substrate.

Figure 26B:
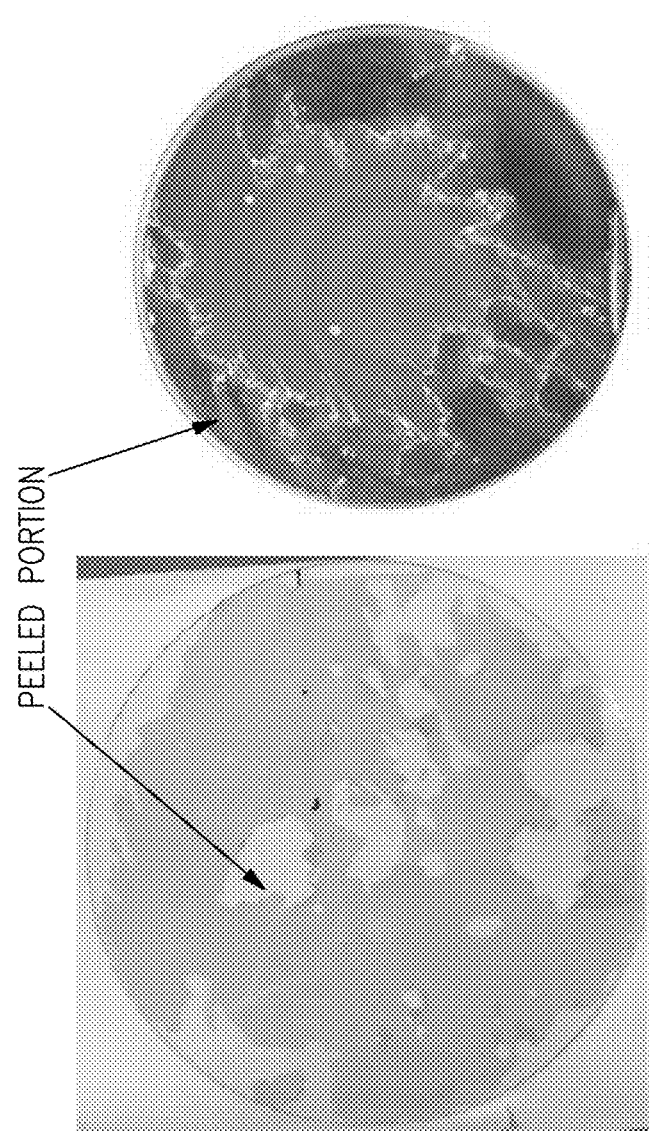
Figure 26A:
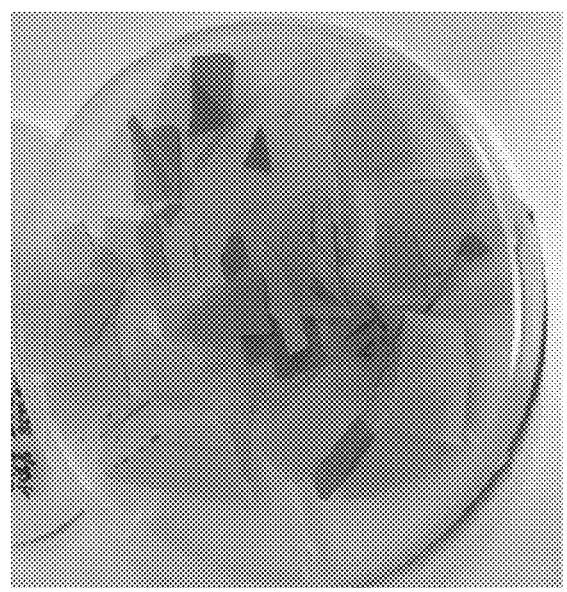

FIG. 26A shows an LT substrate damaged after a heat treatment of 20 hours at 200° C. subsequent to a bonding process of FIGS. 24A-24C.

FIG. 26B shows an example of a substrate partially peeled due to a weak bond strength when the substrate is polished to 5 μm during the process of FIGS. 24A-24C.

Figure 27B:
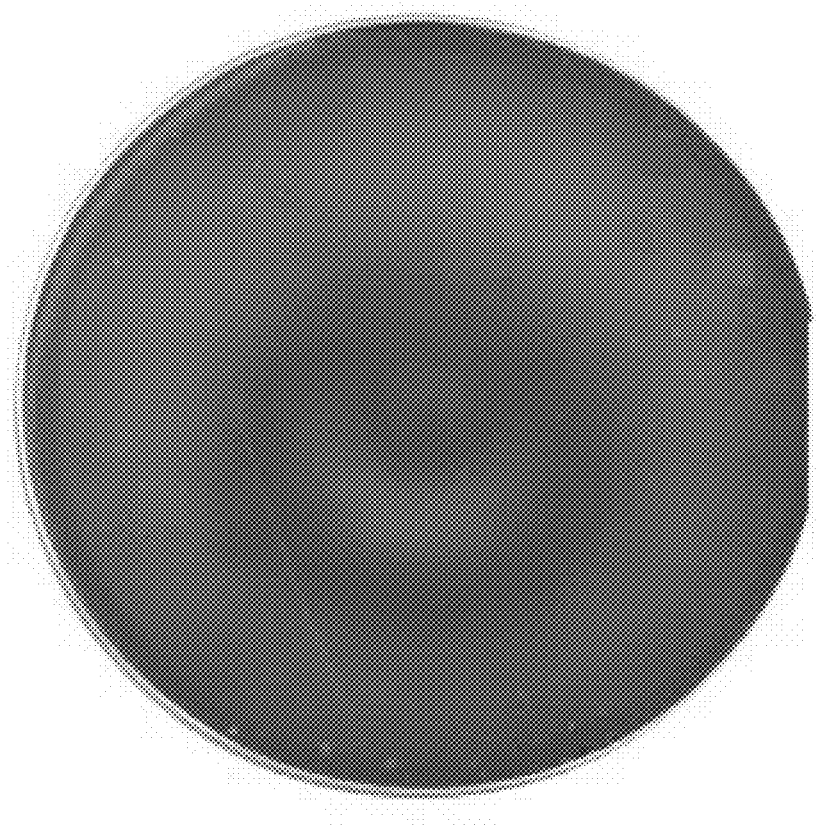
Figure 27A:
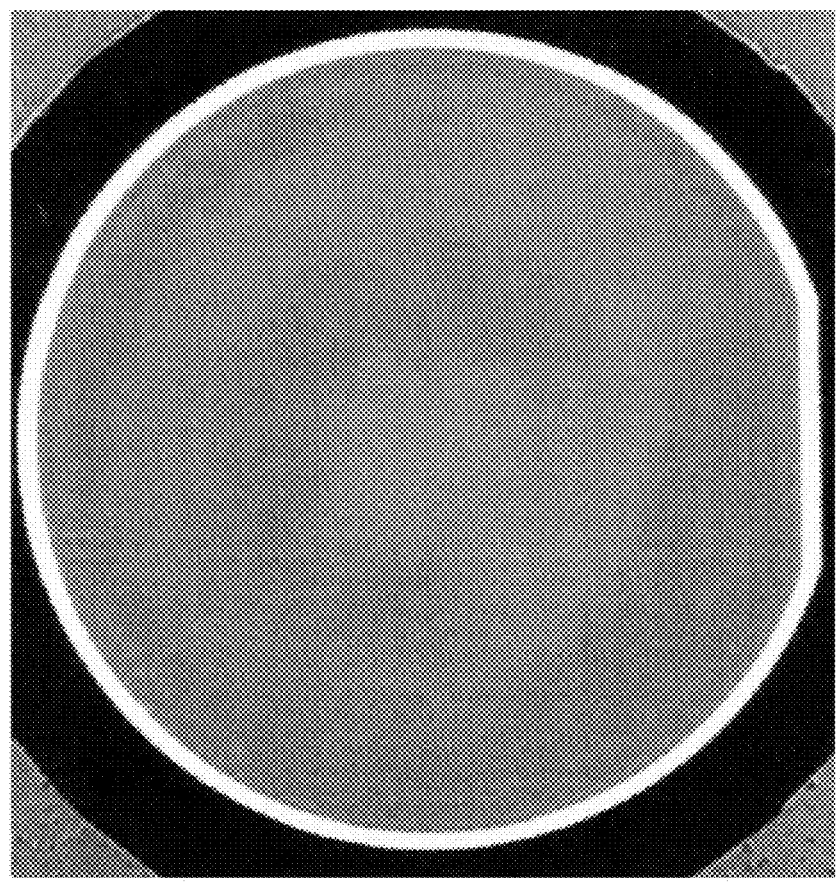

FIG. 27A shows an LT surface obtained after an LT is bonded to a silicon substrate and then the LT is polished to a thickness of 0.3 μm.

FIG. 27B shows an LT surface obtained after a quartz substrate is bonded to the LT surface of the assembly of FIG. 27A and then the silicon substrate is etched by plasma etching.

Figure 28:
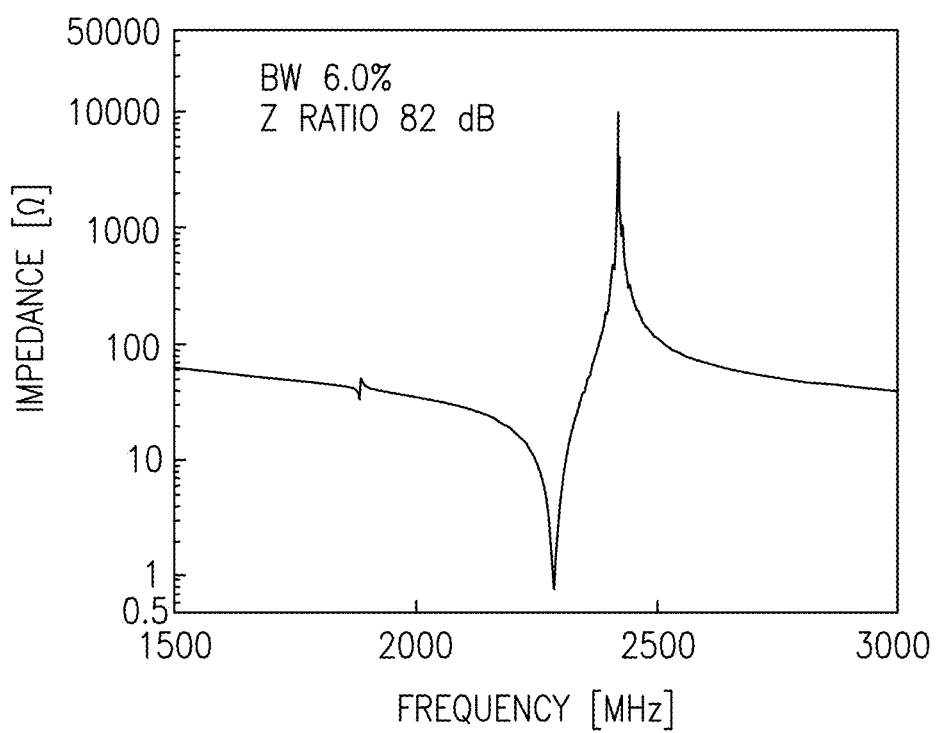

FIG. 28 shows a frequency characteristic of an SAW resonator manufactured by a method similar to the example of FIGS. 25A-25E.

Figure 29:
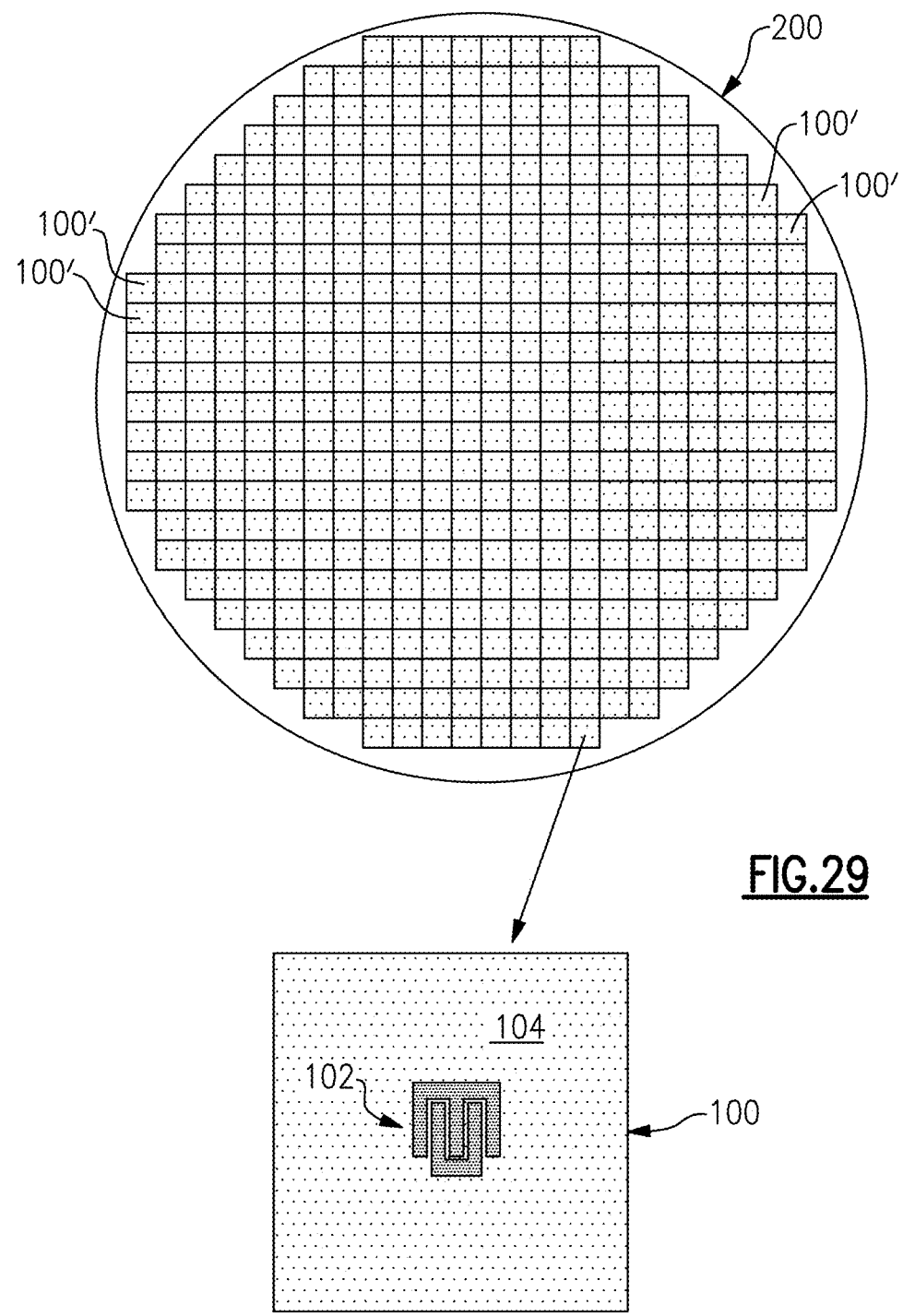

FIG. 29 shows that in some embodiments, multiple units of SAW resonators can be fabricated while in an array form such as in a wafer form.

Figure 30:
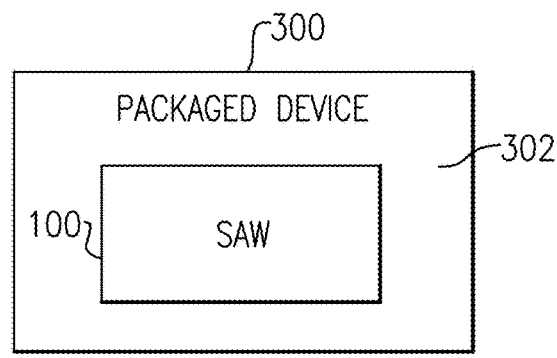

FIG. 30 shows that in some embodiments, a SAW resonator having or more features as described herein can be implemented as a part of a packaged device.

Figure 31:
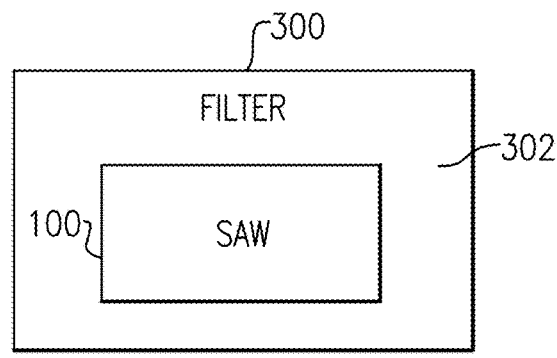

FIG. 31 shows that in some embodiments, the SAW resonator based packaged device of FIG. 30 can be a packaged filter device.

Figure 32:
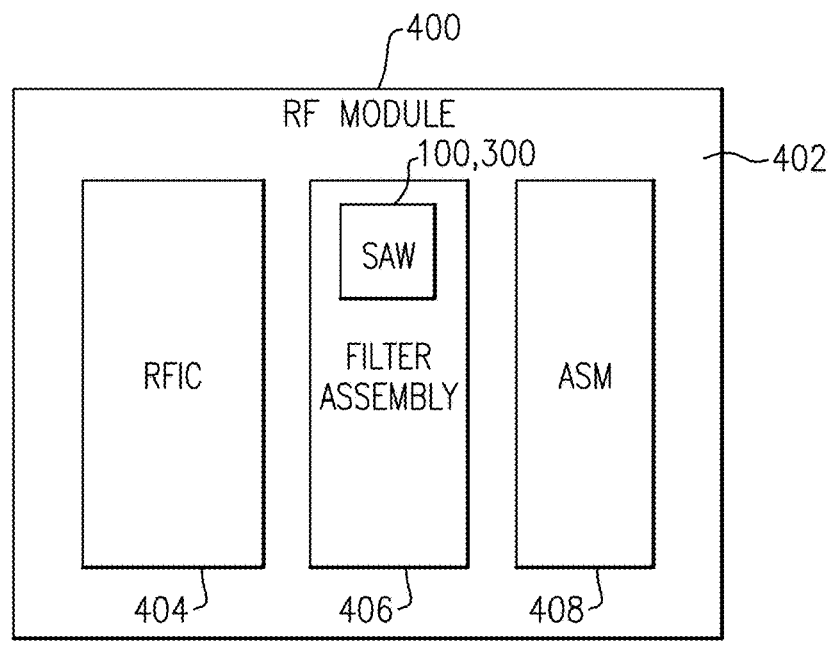

FIG. 32 shows that in some embodiments, a radio-frequency (RF) module can include an assembly of one or more RF filters.

Figure 33:
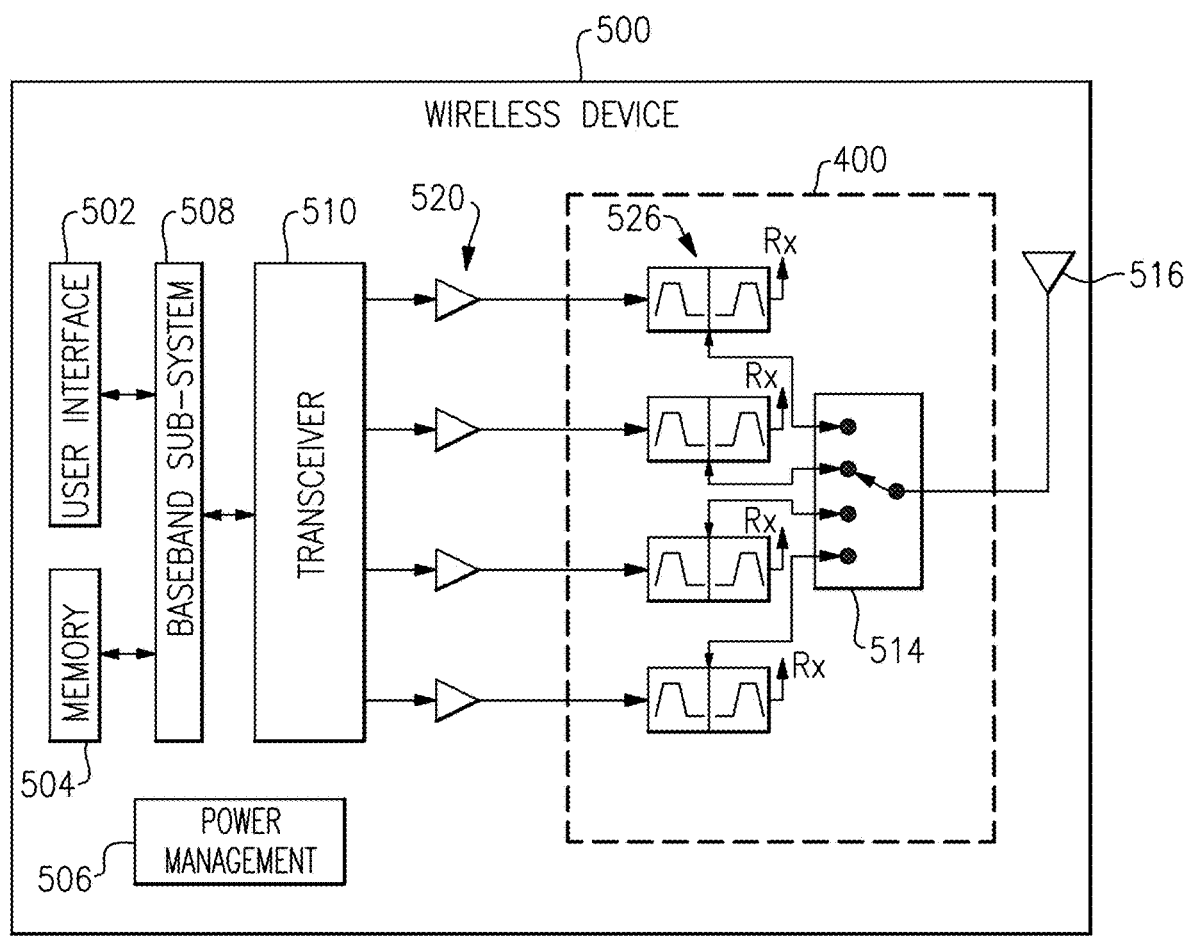

FIG. 33 depicts an example wireless device having one or more advantageous features described herein.

DETAILED DESCRIPTION OF SOME EMBODIMENTS

The headings provided herein, if any, are for convenience only and do not necessarily affect the scope or meaning of the claimed invention.

Frequency bands used for smart phones and the like include approximately 80 bands, which are close to each other, and thus filters and duplexers having a steep frequency characteristic are required or desired. Such filtering applications can include, for example, a ladder-filter structure, in which resonators employing a surface acoustic wave (SAW) or a bulk wave are arranged as a ladder. Accordingly, a resonator having a greater impedance ratio or a high Q is needed or desired to realize a filter or duplexer having a steep frequency characteristic.

Figure 1:
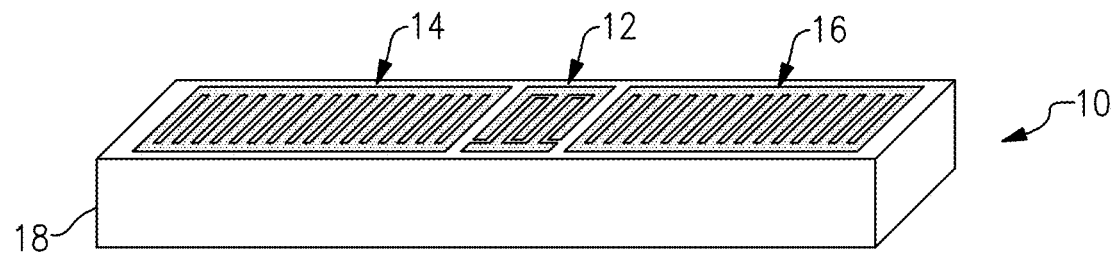
FIG. 1 shows an example of a conventional structure of a surface acoustic wave (SAW) resonator including an inter-digital transducer (IDT) electrode formed on a LiTaO$_3$ (LT) or LiNbO$_3$ (LN) and reflectors formed on both sides of the IDT electrode.

FIG. 1 shows an example of a conventional structure of a surface acoustic wave (SAW) resonator 10 including an interdigital transducer (IDT) electrode 12 formed on a $LiTaO_3$ (LT) or $LiNbO_3$ (LN) substrate 18, and reflectors 14, 16 formed on both sides of the IDT electrode 12.

Figure 2:
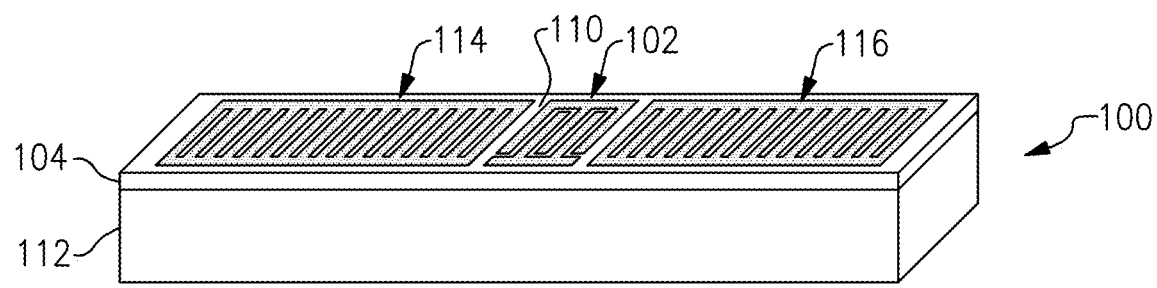
FIG. 2 shows an example of a structure of a SAW resonator including a combination of an LT plate or an LN plate with a quartz substrate.

FIG. 2 shows an example of a surface acoustic wave (SAW) device 100 implemented as a SAW resonator. Such a SAW resonator can include a piezoelectric layer 104 formed of, for example, $LiTaO_3$ (also referred to herein as LT) or $LiNbO_3$ (also referred to herein as LN). Such a piezoelectric layer can include a first surface 110 (e.g., an upper surface when the SAW resonator 100 is oriented as shown) and an opposing second surface. The second surface of the piezoelectric layer 104 can be attached to, for example, a quartz substrate 112.

Figure 3:
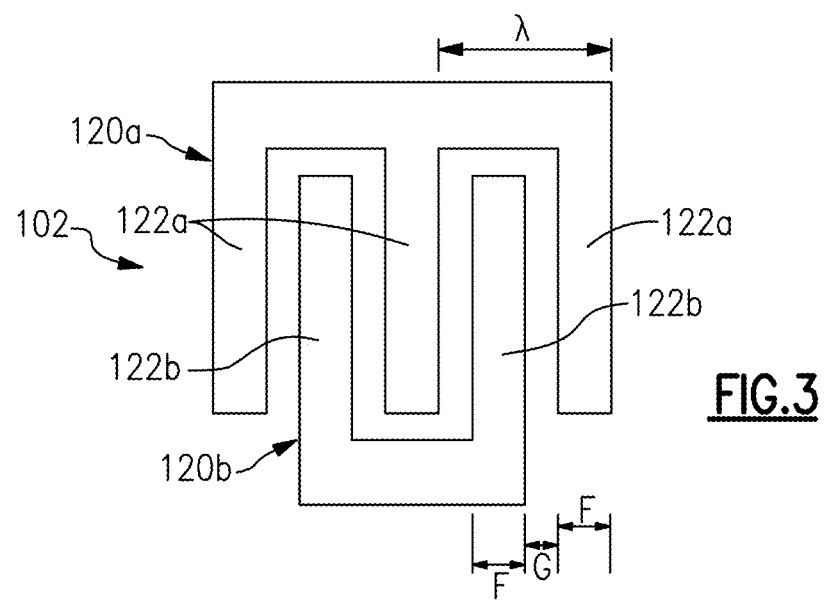
FIG. 3 shows an enlarged and isolated plan view of the IDT electrode of the SAW resonator of FIG. 2.

On the first surface 110 of the piezoelectric layer 104, an interdigital transducer (IDT) electrode 102 can be implemented, as well as one or more reflector assemblies (e.g., 114, 116). FIG. 3 shows an enlarged and isolated plan view of the IDT electrode 102 of the SAW resonator 100 of FIG. 2. It will be understood that the IDT electrode 102 of FIGS. 2 and 3 can included more or less numbers of fingers for the two interdigitized sets of fingers.

In the example of FIG. 3, the IDT electrode 102 is shown to include a first set 120a of fingers 122a and a second set 120b of fingers 122b arranged in an interdigitized manner. In such a configuration, the distance between two neighboring fingers of the same set (e.g., neighboring fingers 122a of the first set 120a) is approximately the same as the wavelength λ of a surface acoustic wave associated with the IDT electrode 102.

In the example of FIG. 3, various dimensions associated with the fingers are shown. More particularly, each finger (122a or 122b) is shown to have a lateral width of F, and a gap distance of G is shown to be provided between two interdigitized neighboring fingers (122a and 122b).

Figure 5:
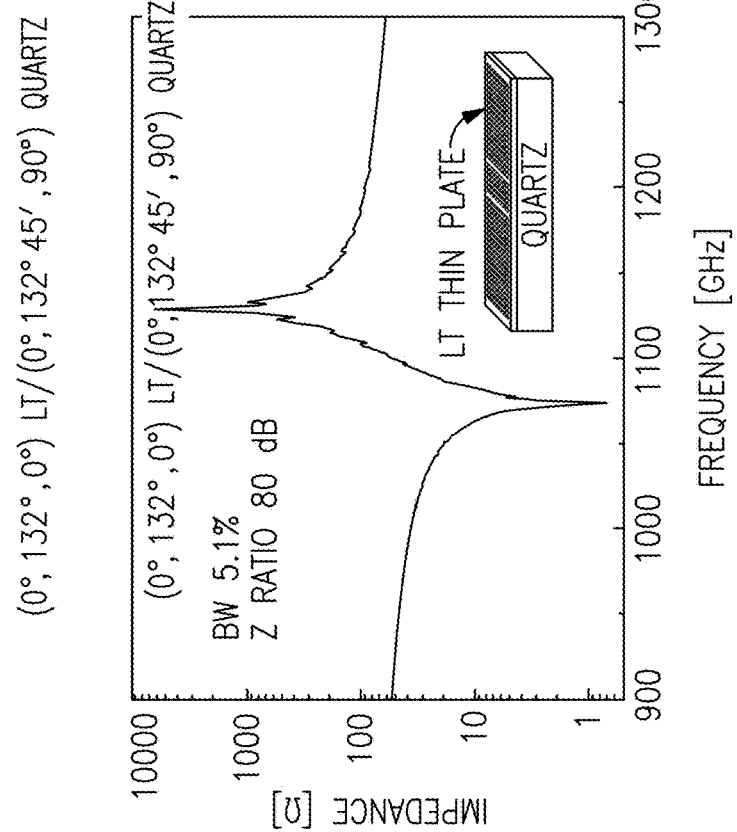
FIG. 5 shows an actual measurement characteristic of a SAW resonator manufactured by combining a Cu electrode, a 42° YXLT ((0°, 132°, 0°) in Euler angle) plate, and a 42° 45'Y90° X ((0°, 132° 45', 90°) in Euler angle) quartz substrate.
Figure 4:
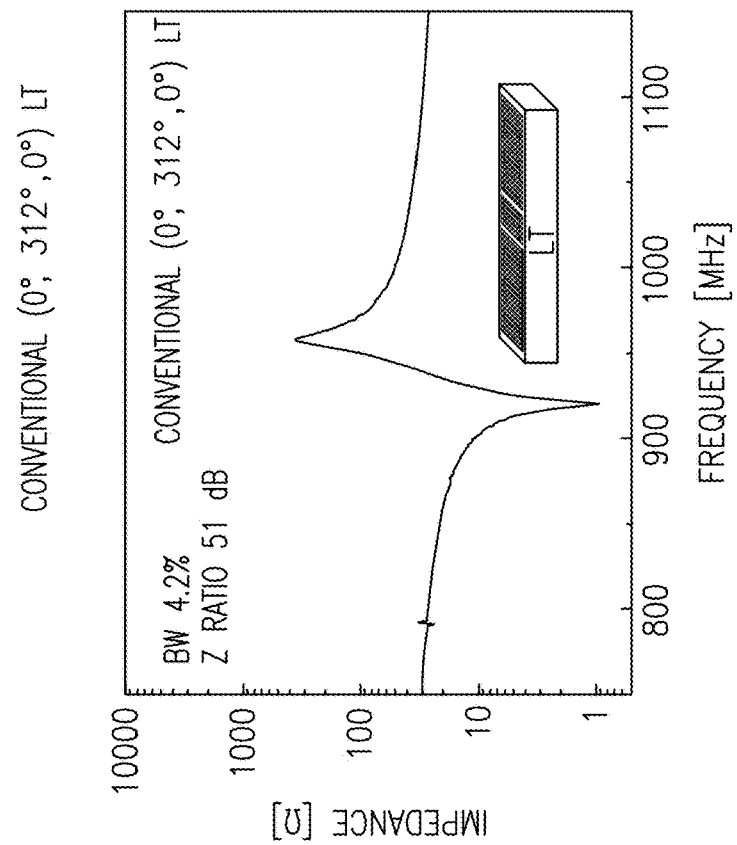
FIG. 4 shows an actual measurement characteristic of a conventional SAW resonator manufactured by forming a copper (Cu) IDT electrode on a 42° YXLT ((0°, 312°, 0°) in Euler angle) substrate.

It is noted that the SAW resonator 100 of FIG. 2 can be configured to provide a greater impedance ratio (e.g., by about 29 dB) than the conventional SAW resonator 10 of FIG. 1. For example, FIG. 4 shows an impedance characteristic plot as a function of frequency for the SAW resonator 10 of FIG. 1, and FIG. 5 shows an impedance characteristic plot as a function of frequency for the SAW resonator 100 of FIG. 2. For the plot of FIG. 4, impedance ratio (20 $\log(Z_a/Z_r)$) is 51 dB, where $Z_r$ and $Z_a$ are impedance values at resonant frequency $f_r$ and antiresonant frequency $f_a$, respectively. For the plot of FIG. 5, impedance ration is 80 dB which is 29 dB greater than that of FIG. 4.

In some implementations, the present disclosure relates to a technique for fabricating a SAW resonator 100 of FIG. 2. Such a technique can allow a fabrication process to avoid or reduce the likelihood of undesirable effects. For example, when an LT or LN is bonded to a quartz substrate, damage may occur due to the thermal expansion difference between the LT or LN and the quartz substrate during a heat treatment process performed to enhance the bond strength. In another example, in a case where a bonded substrate is produced at a lower heat treatment temperature in order to avoid the damage, the bond strength may be weaker and thus the LT or LN may be cracked or peeled from the quartz substrate during a thinning process of the LT or LN plate.

In some embodiments, devices, structures and methods can be utilized to enhance the bond strength by optimally or selectively combining an orientation angle of LT or LN with an orientation angle of quartz substrate, and/or to support a manufacturing process when the bonding is weaker.

It is noted that a bandwidth of an acoustic wave filter depends on the electromechanical coupling coefficient (coupling coefficient) of a piezoelectric substrate used in the acoustic wave filter. Accordingly, a LiTaO3 (LT) or LiNbO3 (LN) substrate having a coupling coefficient necessary for the bandwidth of the filter is used.

In many applications, a resonator having a coupling coefficient satisfying the bandwidth of the filter while having a greater impedance ratio (higher Q) is desired. As described herein, combining a thin-plated LT or LN with a quartz substrate as shown in FIG. 2 may provide a greater impedance ratio and a better temperature characteristic as shown in FIG. 5.

In some embodiments, optimizing or selecting the polarity of the LT or LN piezoelectric thin plate and the polarity of the quartz substrate to be in a desirable relationship may provide an even broader bandwidth and an even greater impedance ratio. For example, bonding a minus (−) surface of the LT or LN with the quartz substrate may provide a broader bandwidth and a greater impedance ratio than bonding a plus (+) surface of the LT or LN with the quartz substrate. Examples of such polarities are described herein in greater detail.

In some embodiments, after bonding the minus surface of the LT or LN to the quartz substrate, the bond strength can be enhanced by a heat treatment. When the linear expansion coefficients in the X-direction (SAW propagation direction) of the LT or LN and in the Y-direction different from the X-direction by 90 degrees are significantly different from those of the quartz substrate, the heat treatment after the bonding process may cause damage to the substrate. When the difference between the expansion coefficients in the X-direction and the Y-direction is greater, damage during the heat treatment is more likely to occur. Therefore, selecting orientations of the layers being bonded may reduce the expansion coefficient difference between the layers. It is noted that even within the same layer, expansion coefficient difference between the X-direction and the Y-direction may be reduced.

It is noted that in some embodiments, in terms of one or more performance properties, a combination of the bonding layers having orientation angles other than the orientation angles for addressing the above-identified problems may be sometimes desired.

It is noted that in some embodiments, a directly bonding technique can be difficult to be applied to an oxide substrate such as LT and quartz. On the other hand, an LT or LN layer and a silicon (Si) layer can be directly bonded to each other and the bonding is sufficiently strong to dispense with the heat treatment. Thus, in some embodiments, after bonding the LT or LN layer to the Si layer by such a directly bonding technique, the LT or LN can be thinned to a desired thickness. Then, a polished surface of the thinned LT or LN plate can be bonded to a quartz substrate, and the Si layer can be etched to realize an assembly of LT, LN thin plate/quartz substrate. Because no polishing process is performed after the above-described processes, mechanical problem associated with polishing is not likely to occur in the manufacturing process even if the bond strength is weak to some extent.

As described above, FIG. 1 shows a conventional structure of a surface acoustic wave (SAW) resonator 10 including an interdigital transducer (IDT) electrode 12 formed on an LT or LN 18 and reflectors 14, 16 formed on both sides of the IDT electrode 12. FIG. 2 shows an example structure of an SAW resonator 100 including a combination of an LT thin plate or an LN thin plate 104 with a quartz substrate 112. An IDT electrode 102 is shown to be formed on a surface 110 of the LT or LN thin plate 104, and reflectors 114, 116 are shown to be formed on both sides of the IDT electrode 102.

As mentioned above, FIG. 4 shows an impedance characteristic plot as a function of frequency for the SAW resonator 10 of FIG. 1, and FIG. 5 shows an impedance characteristic plot as a function of frequency for the SAW resonator 100 of FIG. 2. In the example of FIG. 4, the IDT electrode (12 in FIG. 1) is a copper (Cu) electrode formed in a direction of the SAW propagating in the X-direction (referred to as −plane of 42° YXLT ((0°, 312°, 0°) plane in Euler angle)) on a −plane of 42°-rotated Y-plate LT substrate. In the drawing, a point where the impedance is minimum is referred to as a resonant impedance Zr, its corresponding frequency is referred to as a resonant frequency fr, a point where the impedance is maximum is referred to as an antiresonant impedance Za, and its corresponding frequency is referred to as an antiresonant frequency fa. The bandwidth is represented as (fa−fr)/fr and the impedance ratio is represented as $20*\log(Za/Zr)$.

As also mentioned above, FIG. 5 shows an actual measurement characteristic of an SAW resonator manufactured by combining a 42° YXLT (IDT formed on +plane of 42° YXLT, (0°, 132°, 0°) plane in Euler angle) thin plate with a 42° 45'Y90° X quartz substrate (propagating in a direction offset by 90° from the X-axis: (0°, 132° 45', 90°) in Euler angle). Combining the LT and the quartz may allow the bandwidth to be broader from 4.2% to 5.1% and the impedance ratio to be greater from 51 dB to 80 dB resulting in an improvement of as much as 29 dB. Therefore, combining the LT with the quartz substrate may significantly improve the frequency characteristic.

It is noted that a piezoelectric body has a polarity of plus (+) and minus (−) with respect to the c-axis. For example, the surface expressed as 42°-rotated Y-plate, (0°, 132°, 0°) in Euler angle represents the (+) surface and its rear surface, i.e., 180°-rotated (0°, 312°, 0°), represents the (−) surface.

FIGS. 6A-6H show that in some embodiments, SAW resonators 100 can have different combinations of polarity orientations of a piezoelectric layer 104 (e.g., LT or LN) and polarity orientations of a substrate 112 (e.g., quartz). In FIGS. 6A-6H, the piezoelectric layer 104 of each SAW resonator 100 is shown to include a first surface 103a and a second surface 103b, and the substrate 112 of the same SAW resonator is shown to include a first surface 113a and a second surface 113b. The second surface 103b of the piezoelectric layer 104 is shown to engage the first surface 113a of the substrate 112. Thus, for the purpose of description, second surface 103b of the piezoelectric layer 104 and the first surface 113a of the substrate 112 can be considered to be engaging surfaces, and the first surface 103a of the piezoelectric layer 104 and the second surface 113b of the substrate 112 can be considered to be non-engaging surfaces.

Figure 6A:
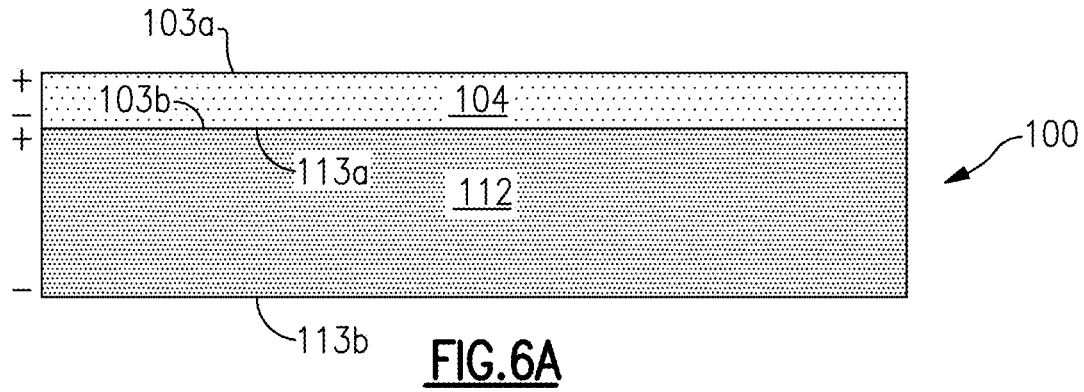
FIGS. 6A-6H shows various combinations of an LT or LN plate with a quartz substrate.

FIG. 6A shows that in some embodiments, the piezoelectric layer 104 of a SAW resonator 100 can be configured so that its polarity results in the engaging surface 103b being a minus (−) surface, and the substrate 112 of the SAW resonator 100 can be configured so that its polarity results in the engaging surface 113a being a plus (+) surface. In such a configuration, the non-engaging surface 103a of the piezoelectric layer 104 is a plus (+) surface, and the non-engaging surface 113b of the substrate 112 is a plus minus (−) surface. More detailed examples of minus (−) and plus (+) surfaces are described herein in reference to FIGS. 7 and 8.

Figure 6B:
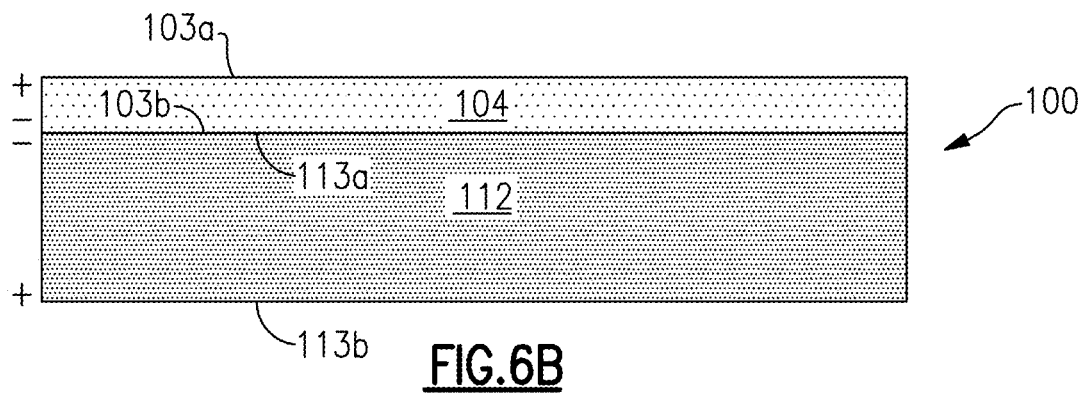

FIG. 6B shows that in some embodiments, the piezoelectric layer 104 of a SAW resonator 100 can be configured so that its polarity results in the engaging surface 103b being a minus (−) surface, and the substrate 112 of the SAW resonator 100 can be configured so that its polarity results in the engaging surface 113a being a minus (−) surface. In such a configuration, the non-engaging surface 103a of the piezoelectric layer 104 is a plus (+) surface, and the non-engaging surface 113b of the substrate 112 is a plus (+) surface.

Figure 6C:
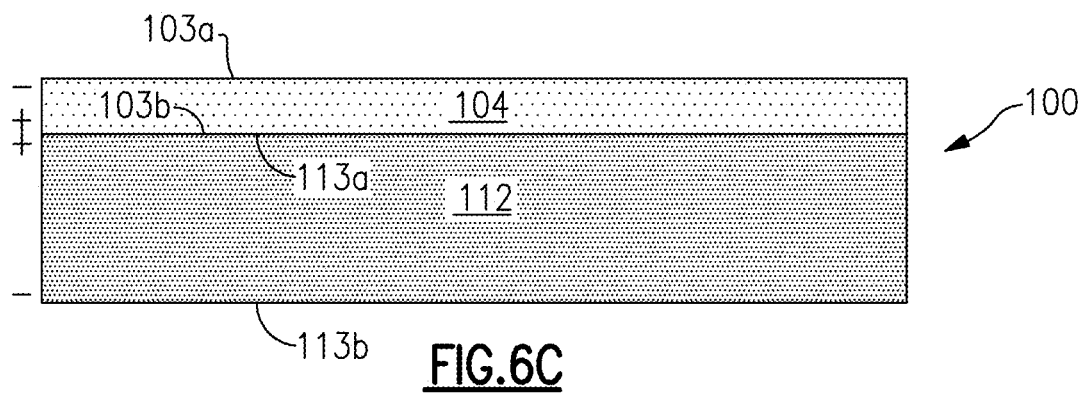

FIG. 6C shows that in some embodiments, the piezoelectric layer 104 of a SAW resonator 100 can be configured so that its polarity results in the engaging surface 103b being a plus (+) surface, and the substrate 112 of the SAW resonator 100 can be configured so that its polarity results in the engaging surface 113a being a plus (+) surface. In such a configuration, the non-engaging surface 103a of the piezoelectric layer 104 is a minus (−) surface, and the non-engaging surface 113b of the substrate 112 is a minus (−) surface.

Figure 6D:
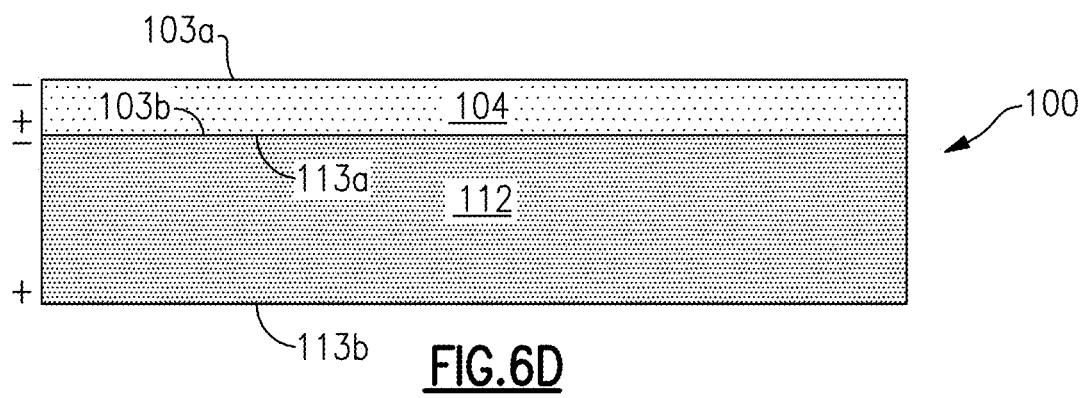

FIG. 6D shows that in some embodiments, the piezoelectric layer 104 of a SAW resonator 100 can be configured so that its polarity results in the engaging surface 103b being a plus (+) surface, and the substrate 112 of the SAW resonator 100 can be configured so that its polarity results in the engaging surface 113a being a minus (−) surface. In such a configuration, the non-engaging surface 103a of the piezoelectric layer 104 is a minus (−) surface, and the non-engaging surface 113b of the substrate 112 is a plus (+) surface.

Figure 6E:
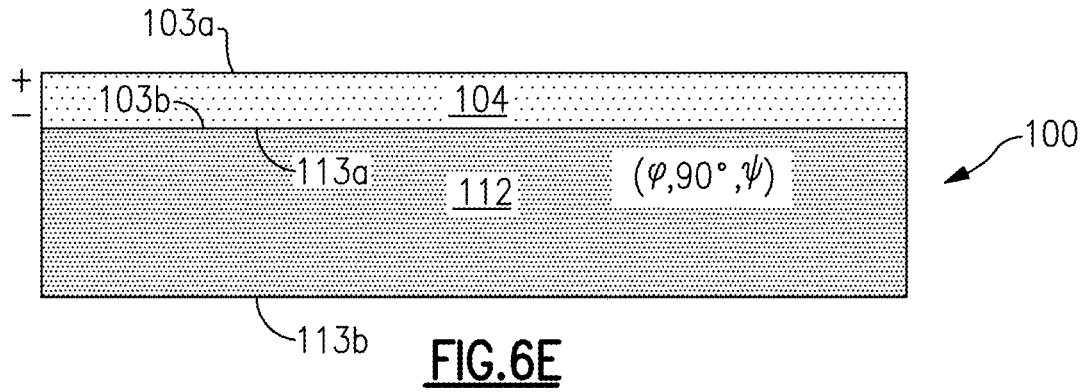

FIG. 6E shows that in some embodiments, the piezoelectric layer 104 of a SAW resonator 100 can be configured so that its polarity results in the engaging surface 103b being a minus (−) surface, and the substrate 112 of the SAW resonator 100 can be configured so that its crystal orientation results in the engaging surface 113a being an unpolarized surface with Euler angles ($\varphi$, 90°, $\psi$). In such a configuration, the non-engaging surface 103a of the piezoelectric layer 104 is a plus (+) surface.

Figure 6F:
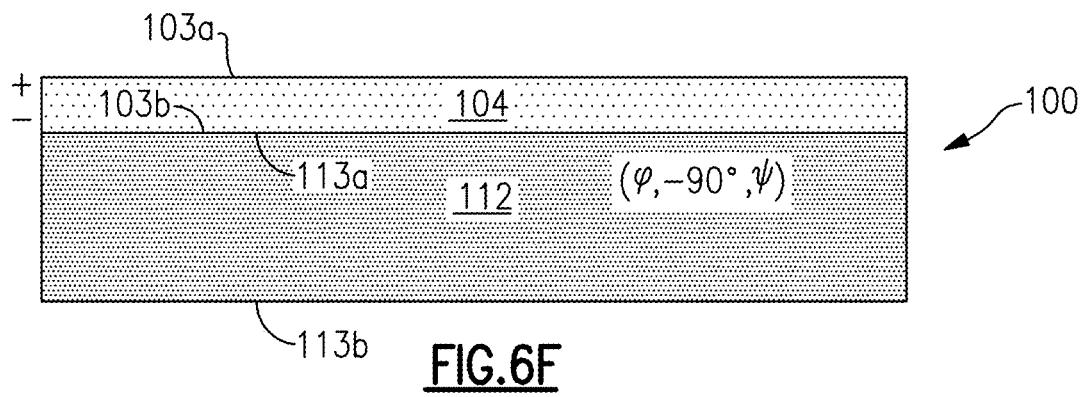

FIG. 6F shows that in some embodiments, the piezoelectric layer 104 of a SAW resonator 100 can be configured so that its polarity results in the engaging surface 103b being a minus (−) surface, and the substrate 112 of the SAW resonator 100 can be configured so that its crystal orientation results in the engaging surface 113a being an unpolarized surface with Euler angles ($\varphi$, −90°, $\psi$). In such a configuration, the non-engaging surface 103a of the piezoelectric layer 104 is a plus (+) surface.

Figure 6G:
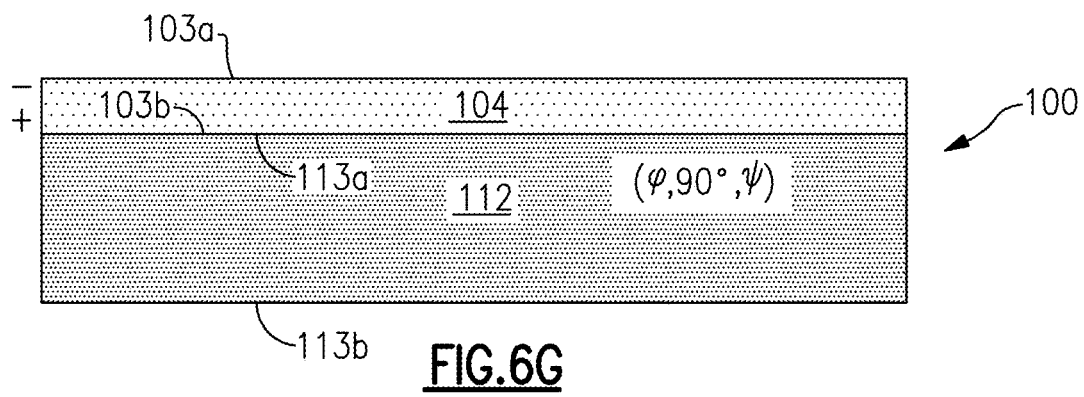

FIG. 6G shows that in some embodiments, the piezoelectric layer 104 of a SAW resonator 100 can be configured so that its polarity results in the engaging surface 103b being a plus (+) surface, and the substrate 112 of the SAW resonator 100 can be configured so that its crystal orientation results in the engaging surface 113a being an unpolarized surface with Euler angles ($\varphi$, 90°, $\psi$). In such a configuration, the non-engaging surface 103a of the piezoelectric layer 104 is a minus (−) surface.

Figure 6H:
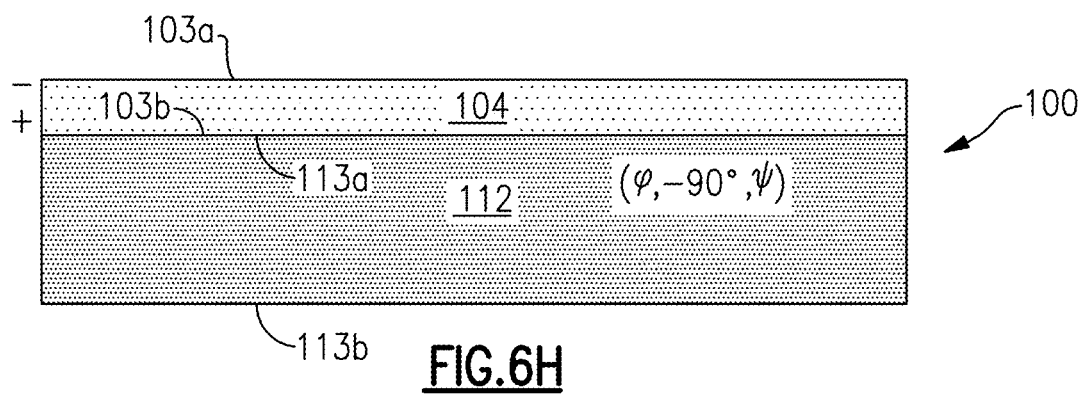

FIG. 6H shows that in some embodiments, the piezoelectric layer 104 of a SAW resonator 100 can be configured so that its polarity results in the engaging surface 103b being a plus (+) surface, and the substrate 112 of the SAW resonator 100 can be configured so that its crystal orientation results in the engaging surface 113a being an unpolarized surface with Euler angles ($\varphi$, −90°, $\psi$). In such a configuration, the non-engaging surface 103a of the piezoelectric layer 104 is a minus (−) surface.

Figure 7A:
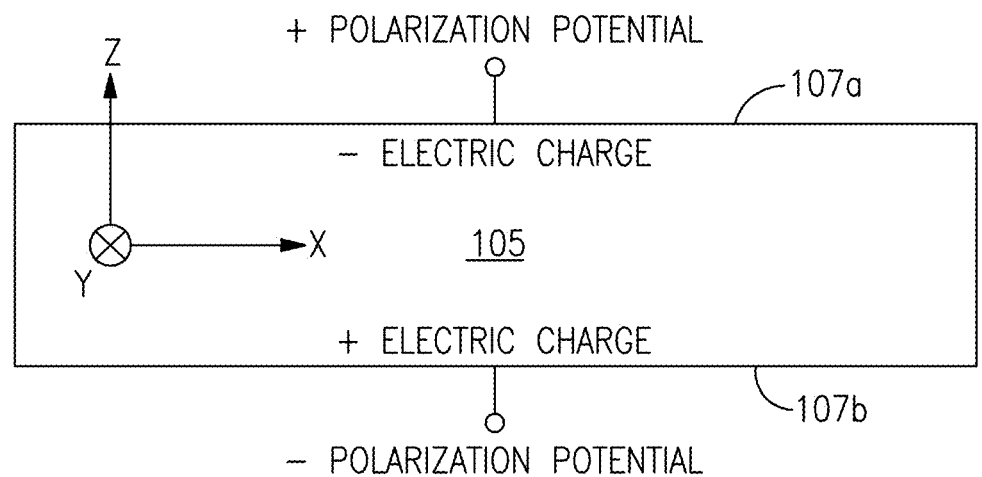
FIGS. 7A and 7B show an example characterization of polarization and surface charge of a layer such as an LT or LN plate or quartz substrate.
Figure 7B:
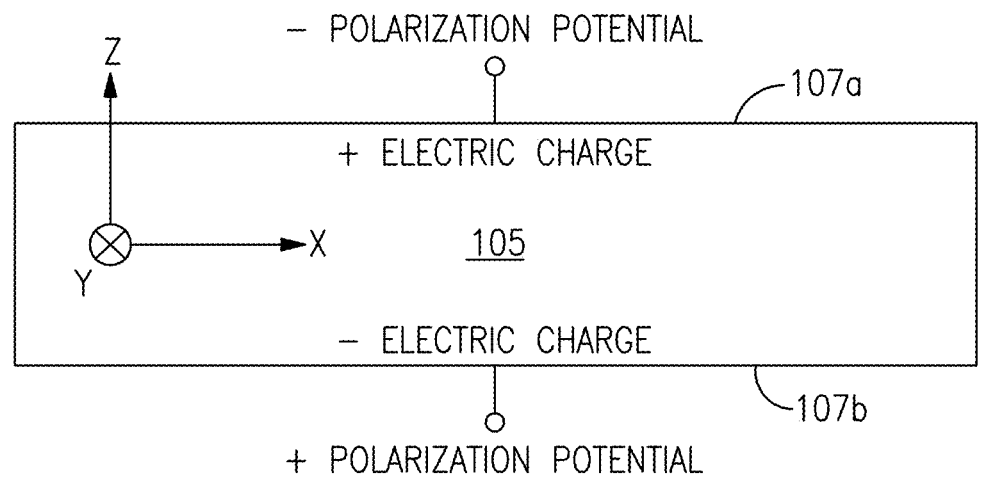

FIGS. 7A and 7B show a body of material 105 that can be a piezoelectric layer such as an LT or LN layer, or a dielectric layer such as a quartz layer. For the purpose of description, such a body is assumed to have a planar shape between first and second surfaces 107a, 107b, with a plane parallel to an XY plane of a rectangular coordinate system. In such a configuration, the X direction can be the direction of propagation of a surface acoustic wave.

In the body 105 of FIGS. 7A and 7B, polarization can exist or be induced, resulting in a net polarization potential difference between the first and second surfaces 107a, 107b. Such a net polarization difference can result in a net electric charge of one type on the first surface 107a, and a net electric charge of the other type on the second surface 107b.

For example, and as shown in FIG. 7A, when the first surface 107a has a positive (+) polarization potential and the second surface 107b has a negative (−) polarization potential, the first surface 107a has a negative (−) electric charge and the second surface 107n has a positive (+) electric charge. Conversely, and as shown in FIG. 7B, when the first surface 107a has a negative (−) polarization potential and the second surface 107b has a positive (+) polarization potential, the first surface 107a has a positive (+) electric charge and the second surface 107n has a negative (−) electric charge.

For the purpose of description, and unless specified otherwise, a plus (+) surface of the body 105 can correspond to the surface with a positive (+) polarization potential, and a minus (−) surface of the body 105 can correspond to the surface with a negative (−) polarization potential. Accordingly, the plus (+) and minus (−) surfaces of the piezoelectric layer 104 and the substrate 112 of FIGS. 6A-6D can be understood to follow the foregoing example definition.

It will be understood that plus (+) and minus (−) surfaces of a body can be defined in other manners. For example, plus (+) and minus (−) surfaces can be defined to correspond to the electric charges of the surfaces. In such a context, a plus (+) surface of a body can correspond to the surface with a positive (+) electrical charge, and a minus (−) surface of the body can correspond to the surface with a negative (−) electrical charge.

Figure 8A:
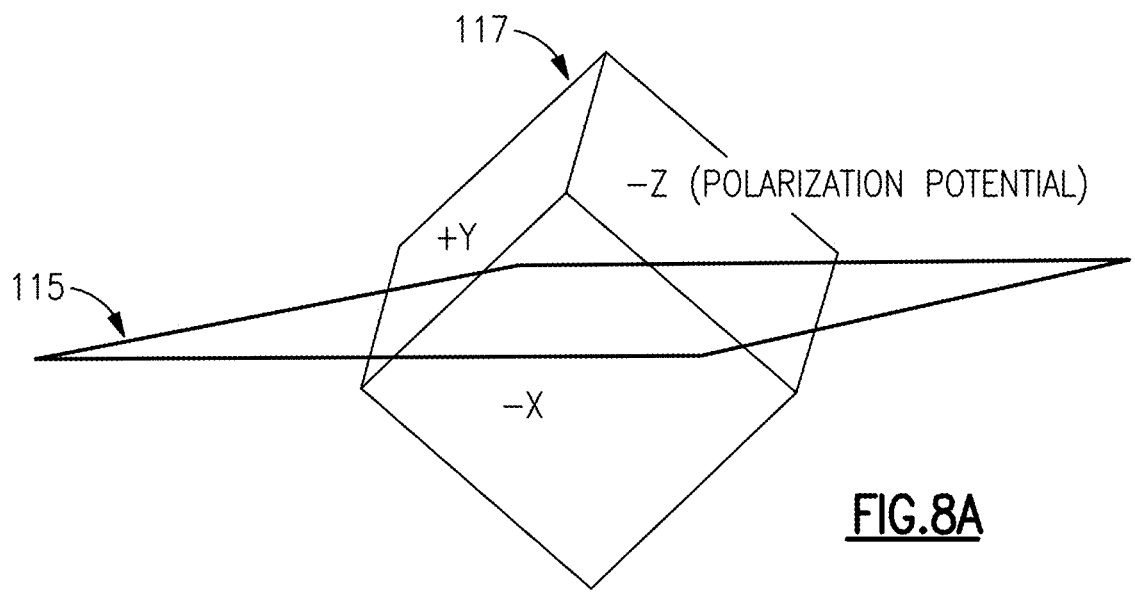
FIGS. 8A and 8B show polarizations of example LT crystal orientations relative to a reference coordinate system.

FIG. 8A shows an example of a unit cell 117 of a crystal structure of the body 105 of FIGS. 7A and 7B. Such a unit cell is shown to have a crystal orientation relative to a reference plane 115 that is parallel with the XY plane of the body 105 to provide a negative (−) polarization potential for the corresponding surface of the body 105. Accordingly, such a surface is a minus (−) surface.

It is noted that, for example, an LT crystal having a 42° Y configuration (42° YLT) can represent a plus (+) ((0°, 132°, 0°) in Euler angle) or minus (−) ((0°, 312°, 0°) in Euler angle) plane. When using only a normal LT or LN, both of such Euler angle configurations ((0°, 132°, 0°) and (0°, 312°, 0°)) provide similar frequency characteristics as described herein (e.g., in reference to FIGS. 10A and 10B). However, it is easier and faster to polish a (0°, 312°, 0°) plane when compared to a (0°, 132°, 0°) plane. Accordingly, in some embodiments, a plane utilized for the example 42° YX LT is a (0°, 312°, 0°) plane.

Figure 8B:
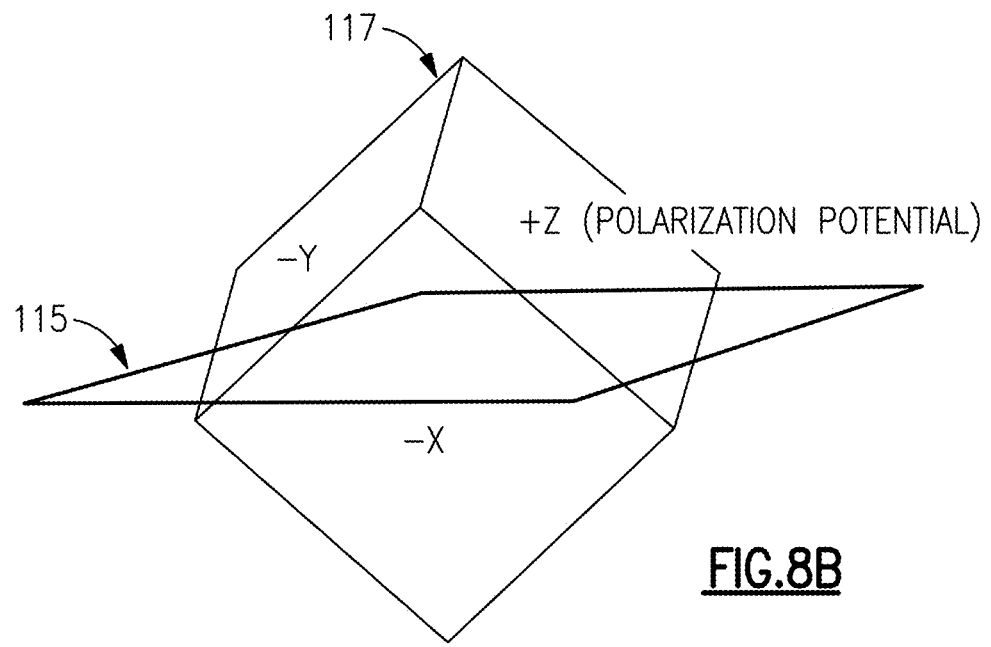

FIG. 8B shows another example of a unit cell 117 of a crystal structure of the body 105 of FIGS. 7A and 7B. Such a unit cell is shown to have a crystal orientation relative to a reference plane 115 that is parallel with the XY plane of the body 105 to provide a positive (+) polarization potential for the corresponding surface of the body 105. Accordingly, such a surface is a plus (+) surface.

By way of an example, an LT crystal having the foregoing plus (+) surface includes Euler angles (0°, 132°, 0°). Thus, a minus (−) surface corresponding to a negative (−) polarization potential surface for a 42° YX configuration (42° YXLT) can be expressed as having Euler angles (0°, 312°, 0°). As described in reference to FIG. 8A, use of such a surface (with Euler angles (0°, 312°, 0°)) can be preferred in some embodiments.

For the purpose of description, and referring to FIGS. 6 and 7, Euler angles defined for a positive (+) polarization potential surface include (0°, 90°<θ<270°, 0°). Further, Euler angles defined for a negative (−) polarization potential surface include (0°, −90°<θ<90°, 0°). Accordingly, if plus (+) and minus (−) surfaces follow the positive (+) and negative (−) polarization potential surfaces, Euler angles defined for a plus (+) surface include (0°, 90°<θ<270°, 0°), and Euler angles defined for a minus (−) surface include (0°, −90°<θ<90°, 0°).

For the purpose of description, it will be understood that an angle α can be expressed in equivalent forms as α±n360°, where n is an integer. For example, Euler angles (0°, 90°<θ<270°, 0°) will be understood to be equivalent to (0°, −270°<θ<−90°, 0°). In another example, Euler angles (0°, −90°<θ<90°, 0°) will be understood to be equivalent to (0°, 270°<θ<450°, 0°).

In the context of the foregoing example definition of plus (+) and minus (−) surfaces, Table 1 summarizes the SAW resonator configurations of FIGS. 6A-6D, with an assumption that the piezoelectric layer 104 is LT and the substrate 112 is quartz, and with an understanding that the Euler angles correspond to the upper surface (103a for the LT layer 104, and 113a for the quartz layer 112) of the corresponding layer when viewed as depicted.

TABLE 1

| FIG. | Surface combination | Combination of Euler angles |
| --- | --- | --- |
| 6A | +LT−/+quartz− | (0°, 90° < θ < 270°, 0°) LT/(φ, 90° < θ < 270°, ψ) quartz |
| 6B | +LT−/−quartz+ | (0°, 90° < θ < 270°, 0°) LT/(φ, −90° < θ < 90°, ψ) quartz |
| 6C | −LT+/+quartz− | (0°, −90° < θ < 90°, 0°) LT/(φ, 90° < θ < 270°, ψ) quartz |
| 6D | −LT+/−quartz+ | (0°, −90° < θ < 90°, 0°) LT/(φ, −90° < θ < 90°, ψ) quartz |

In the examples of Table 1, each quartz substrate is configured to include plus (+) and minus (−) surfaces corresponding to the respective Euler angles. It is noted that when the polarization plane (e.g., Z plane) of a quartz crystal is perpendicular to the surface of the SAW plane (e.g., (90°, 90°, 90°) or (90°, −90°, 90°) in Euler angles), the corresponding quartz substrate does not have (+) and (−) surfaces associated with the polarization plane. In some embodiments, SAW resonators utilizing such a quartz substrate can be implemented.

Table 2 summarizes the SAW resonator configurations of FIGS. 6D-6G, with an assumption that the piezoelectric layer 104 is LT and the substrate 112 is quartz, and with an understanding that the Euler angles correspond to the upper surface (103a for the LT layer 104, and 113a for the quartz layer 112) of the corresponding layer when viewed as depicted.

TABLE 2

| FIG. | Surface combination | Combination of Euler angles |
| --- | --- | --- |
| 6E | +LT−/quartz | (0°, 90° < θ < 270°, 0°) LT/(φ, 90°, ψ) quartz |
| 6F | +LT−/quartz | (0°, 90° < θ < 270°, 0°) LT/(φ, −90°, ψ) quartz |
| 6G | −LT+/quartz | (0°, −90° < θ < 90°, 0°) LT/(φ, 90°, ψ) quartz |
| 6H | −LT+/quartz | (0°, −90° < θ < 90°, 0°) LT/(φ, −90°, ψ) quartz |

As described herein in greater detail, it is noted that a SAW resonator having a +LT−/quartz configuration (e.g., FIG. 6E or FIG. 6F) has a higher impedance ratio when compared a SAW resonator with a −LT+/quartz configuration (e.g., FIG. 6G or FIG. 6H).

Measurements of bonding strengths for the surface combinations of LT and quarts listed in Tables 1 and 2 are as follows. For the +LT−/+quartz− configuration (FIG. 6A), measured bonding strength (2γ) is 2.2 Joul/m². For the +LT−/−quartz+ configuration (FIG. 6B), measured bonding strength (2γ) is 2.0 Joul/m². For the −LT+/+quartz− configuration (FIG. 6C), measured bonding strength (2γ) is 1.8 Joul/m². For the −LT+/−quartz+ configuration (FIG. 6D), measured bonding strength (2γ) is 2.0 Joul/m². For the +LT−/quartz configuration of FIG. 6E, measured bonding strength (2γ) is 1.9 Joul/m². For the +LT−/quartz configuration of FIG. 6F, measured bonding strength (2γ) is 1.9 Joul/m². For the −LT+/quartz configuration of FIG. 6G, measured bonding strength (2γ) is 1.9 Joul/m². For the −LT+/quartz configuration of FIG. 6H, measured bonding strength (2γ) is 1.9 Joul/m². It is noted that among the eight configurations listed in Tables 1 and 2, the configuration of FIG. 6A (+LT−/+quartz−) provides the highest bonding strength (2γ=2.2 Joul/m²).

In the foregoing measurement examples, bonding strength is expressed as 2γ, where γ is a bond strength between two substrates as disclosed in Tong, Q., Goesele, U., and Society, E. (1999) Semiconductor Wafer Bonding: Science and Technology, John Wiley & Sons, Inc., New York. Examples related to bonding strengths in various manufacturing process steps are described herein in greater detail.

In some embodiments, the angle φ in Tables 1 and 2 for quartz substrates can have a value in a range of 0°≤φ<180°. For example, a quartz substrate can have a configuration where φ=0° or φ=90°. In some embodiments, the angle ψ in Tables 1 and 2 for quartz substrates can have a value in a range of 0°≤ψ<180°. For example, a quartz substrate can have a configuration where ψ=0° or ψ=90°.

It will be understood that the surface combinations and Euler angle combinations as defined in Tables 1 and 2 can also apply to other piezoelectric layers (including an LN layer) and/or other substrate layers.

It will also be understood that a plus (+) surface can also be referred to herein as simply a (+) surface, and a minus (−) surface can also be referred to herein as simply a (−) surface.

Figure 9A:
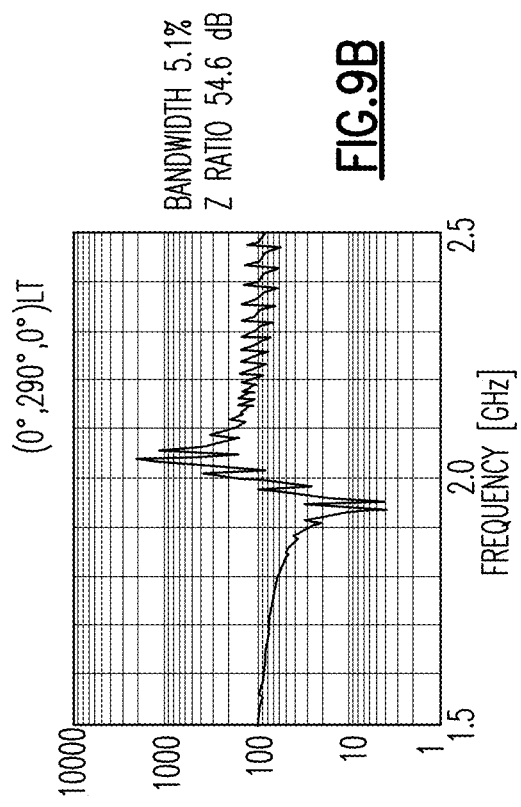
FIGS. 9A and 9B show frequency characteristics of SAW resonators in which an aluminum electrode having a wavelength (λ) of 2 μm and a thickness of 0.08λ is formed on the (+) surface of a 20°-rotated Y-plate X-propagation LT ((0°, 110°, 0°) in Euler angle) and the (−) surface thereof ((0°, 290°, 0°) in Euler angle) respectively.
Figure 10A:
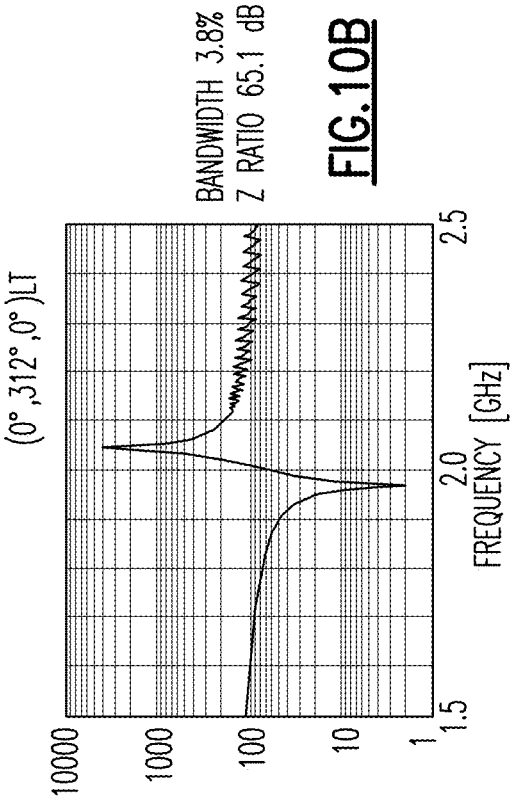
FIGS. 10A and 10B show frequency characteristics of SAW resonators in which the electrode of FIGS. 9A and 9B is formed on the (+) surface of a 42°-rotated Y-plate X-propagation LT ((0°, 132°, 0°) in Euler angle) and the (−) surface thereof ((0°, 312°, 0°) in Euler angle) respectively.
Figure 9B:
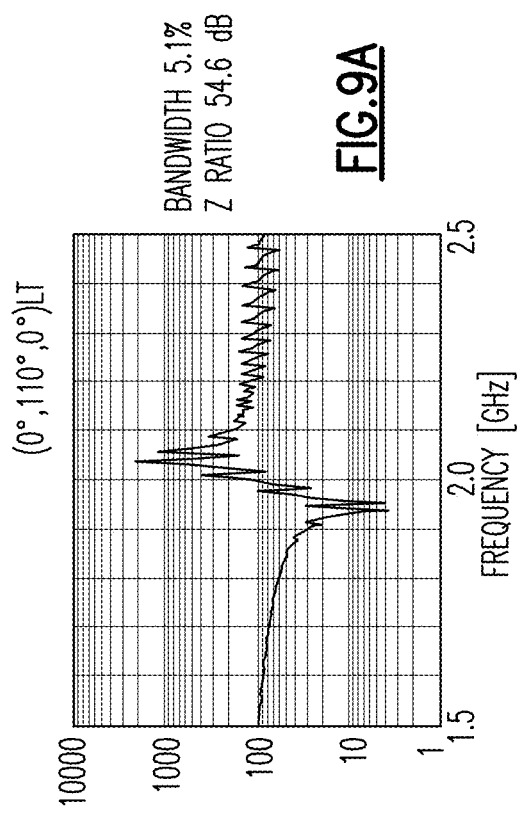
Figure 10B:
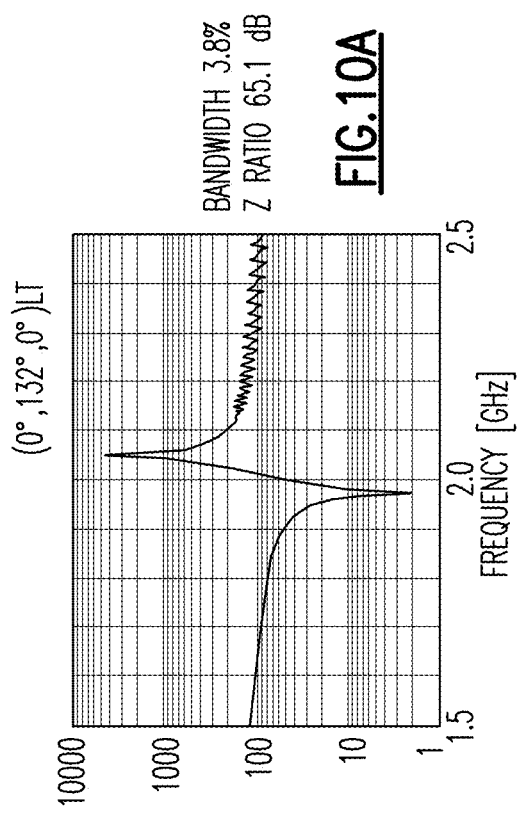

FIGS. 9A and 9B show characteristics of SAW resonators in which an Aluminum electrode having a wavelength (λ) of 2 μm and a thickness of 0.08λ is formed on the (+) surface of a 20°-rotated Y-plate X-propagation LT ((0°, 110°, 0°) in Euler angle) and the (−) surface ((0°, 290°, 0°) in Euler angle) respectively. FIGS. 10A and 10B show characteristics of SAW resonators in which the same electrode is formed on the (+) surface of a 42°-rotated Y-plate X-propagation LT ((0°, 132°, 0°) in Euler angle) and the (−) surface ((0°, 312°, 0°) in Euler angle) respectively. As can be seen from these impedance characteristic plots, even though an electrode is formed on either of the (+) or (−) surface of a normal LT substrate, there is essentially no difference in the bandwidth, impedance ratio, resonant frequency, anti-resonant frequency, spurious mode, and the like among the corresponding SAW resonators.

Based on the foregoing examples, one can see that there is no difference in impedance characteristics between (+) and (−) surfaces of a normal LT substrate. Accordingly, in general, when a normal LT substrate is utilized, the (+) plane and the (−) plane are not distinguished. However, because the (−) plane is easier to polish, such a surface is typically utilized in a normal LT substrate. For example, a (0°, 312°, 0°) plane is typically utilized in the example case of a normal 42° YX LT.

FIGS. 11 to 14 show various examples of characteristics associated with different combinations of LT orientations and quartz orientations. More general forms of such combinations (of piezoelectric layer 104 and substrate layer 112) are shown in FIGS. 6A-6D.

By way of an example, (+) and (−) surfaces of a 20°-rotated Y-plate X-propagation LT ((0°, 110°, 0°) and (0°, 290°, 0°) in Euler angle respectively), and (+) and (−) surfaces of a 42° 45' Y-plate 90° X-propagation quartz ((0°, 132° 45', 90°) and (0°, 312° 45', 90°)) were prepared to form four SAW resonators corresponding to the four combinations as shown in FIGS. 6A-6D, and their frequency characteristics were obtained. FIGS. 11A-11D show these characteristics.

Referring to FIGS. 6A-6D and FIGS. 11A-11D, it is noted that the combination of the LT whose electrode-side is the (+) surface and whose surface bonded to the quartz is the (−) surface with the quartz whose bonded surface is the (+) surface (FIG. 6A) and the combination of the same LT with the quartz whose bonded surface is the (−) surface (FIG. 6B) show essentially the same bandwidth and impedance ratio as shown in FIGS. 11A and 11B respectively. It is also noted that the combination of the LT whose electrode-side is the (−) surface and whose surface bonded to the quartz is the (+) surface with the quarts whose bonded surface is the (+) surface (FIG. 6C) and the combination of the same LT with the quartz whose bonded surface is the (−) surface (FIG. 6D) show essentially the same bandwidth and impedance ratio as shown in FIGS. 11C and 11D respectively. However, the embodiments shown in FIGS. 11A and 11B indicate that a 13% broader bandwidth and 2 dB greater impedance ratio can be obtained when compared to the embodiments shown in FIGS. 11C and 11D. It is noted that the value of 13% is calculated by 6.2%/5.5% as indicated in FIGS. 11A-11D.

Accordingly, regardless of the (+) surface or the (−) surface of the quartz, the structures of the LT whose bonded surface is a (−) surface as shown in FIGS. 6A and 6B can result in a better characteristic.

Figure 12B:
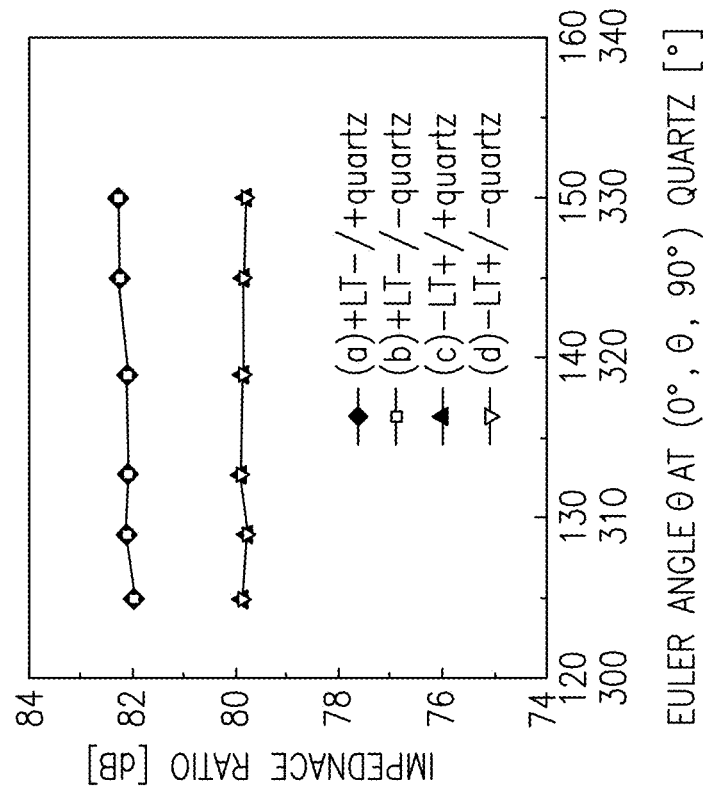
FIGS. 12A and 12B show an Euler angle dependence of the bandwidth and the impedance ratio for an SAW resonator formed according to four combinations of the (+) and (−) surfaces of a 20°-rotated Y-plate X-propagation LT with the (+) and (−) surfaces of a rotation 35° Y-plate 90° X-propagation to 60° Y-plate 90° X-propagation quartz.
Figure 12A:
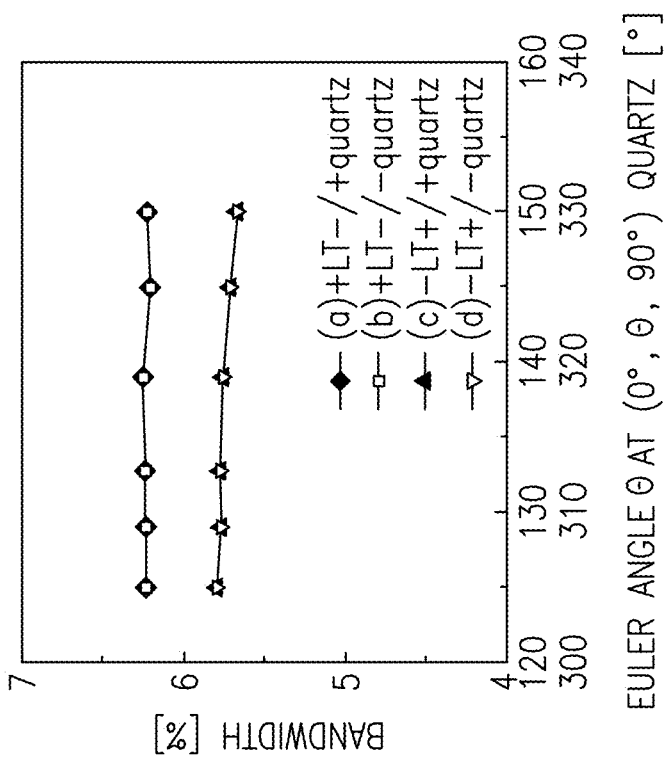

By way of another example, (+) and (−) surfaces of a 20°-rotated Y-plate X-propagation LT ((0°, 110°, 0°) and (0°, 290°, 0°) in Euler angle respectively), and (+) surface of a rotation 35° Y-plate 90° X-propagation to 60° Y-plate 90° X-propagation quartz ((0°, 125°, 90°) to (0°, 150°, 90°) in Euler angle) and the (−) surface of the same quartz ((0°, 305°, 90°) to (0°, 330°, 90°) in Euler angle) were prepared to form four SAW resonators corresponding to the four combinations as shown in FIGS. 6A-6D, and their frequency characteristics were obtained. The bandwidths and impedance ratios of the four structural combinations are shown in FIGS. 12A and 12B as a function of Euler angle θ of the quartz. Throughout the quartz of any Euler angle θ, a broader bandwidth and a greater impedance ratio are obtained from the structures of FIGS. 6A and 6B than those of FIGS. 6C and 6D.

Figure 13B:
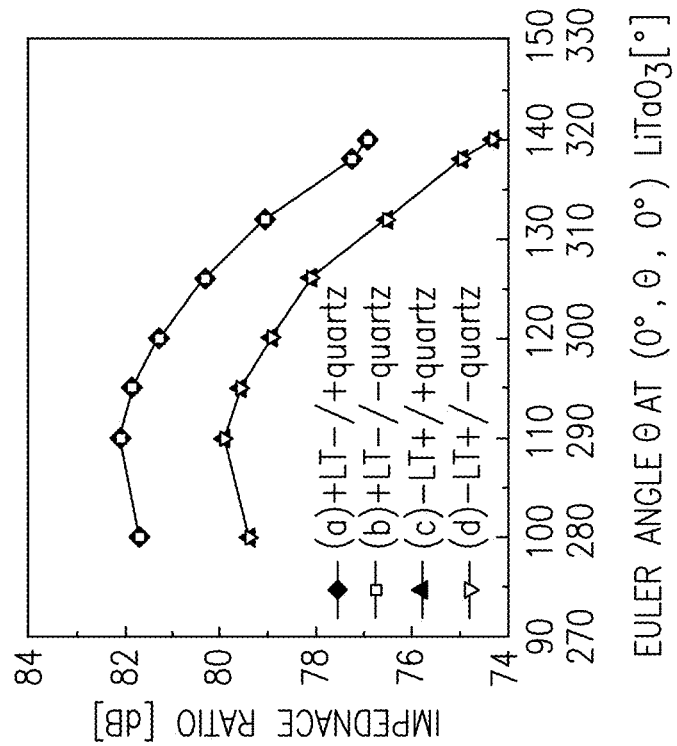
FIGS. 13A and 13B show an Euler angle dependence of the bandwidth and the impedance ratio for an SAW resonator formed according to four combinations of the (+) and (−) surfaces of a rotation 10° X-propagation to 50° YX-propagation LT with the (+) and (−) surfaces of a 42° 45'Y-plate 90° X-propagation quartz.
Figure 13A:
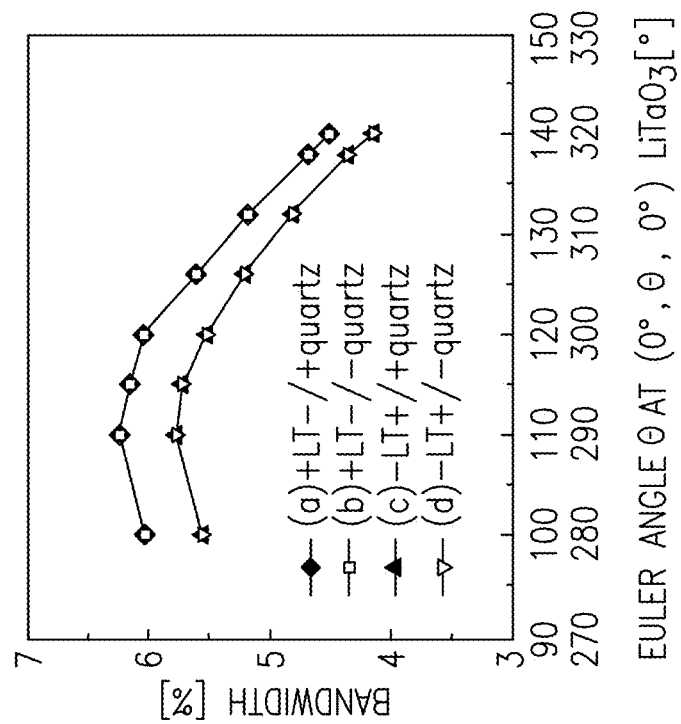

By way of another example, (+) surface of a rotation 10° X-propagation to 50° YX-propagation LT ((0°, 100°, 0°) to (0°, 140°, 0°) in Euler angle) and the (−) surface of the same LT ((0°, 280°, 0°) to (0°, 320°, 0°) in Euler angle), and (+) and (−) surfaces of a 42° 45' Y-plate 90° X-propagation quartz ((0°, 132° 45', 90°) and (0°, 312° 45', 90°) in Euler angle respectively) were prepared. The frequency characteristics of the SAW resonators were obtained for the four combinations as shown in FIGS. 6A-6D. The bandwidths and impedance ratios of the four structural combinations are shown in FIGS. 13A and 13B as a function of Euler angle θ of the LT. For the LT of any Euler angles, broader bandwidths and greater impedance ratios can be obtained from the structures of FIGS. 6A and 6B than those of FIGS. 6C and 6D.

In the various examples of FIGS. 11-13, the piezoelectric layers are LT layers. Similar results can be obtained if LN is used as piezoelectric layers.

Figure 14B:
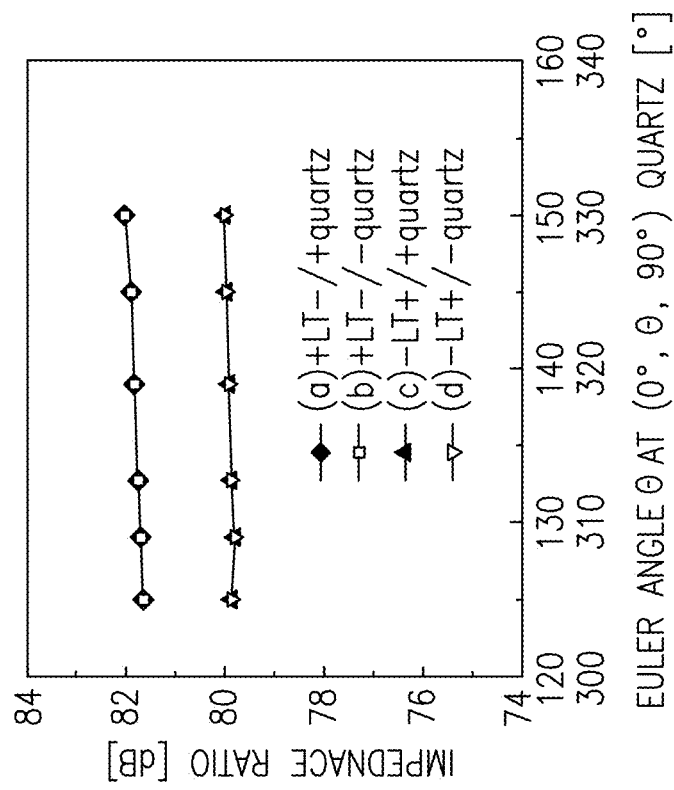
FIGS. 14A and 14B show an Euler angle dependence of the bandwidth and the impedance ratio for an SAW resonator formed according to four combinations of the (+) and (−) surfaces of a 25°-rotation Y-plate X-propagation LN with the (+) and (−) surfaces of a rotation 35° Y-plate 90° X-propagation to 60° Y-plate 90° X-propagation quartz.
Figure 14A:
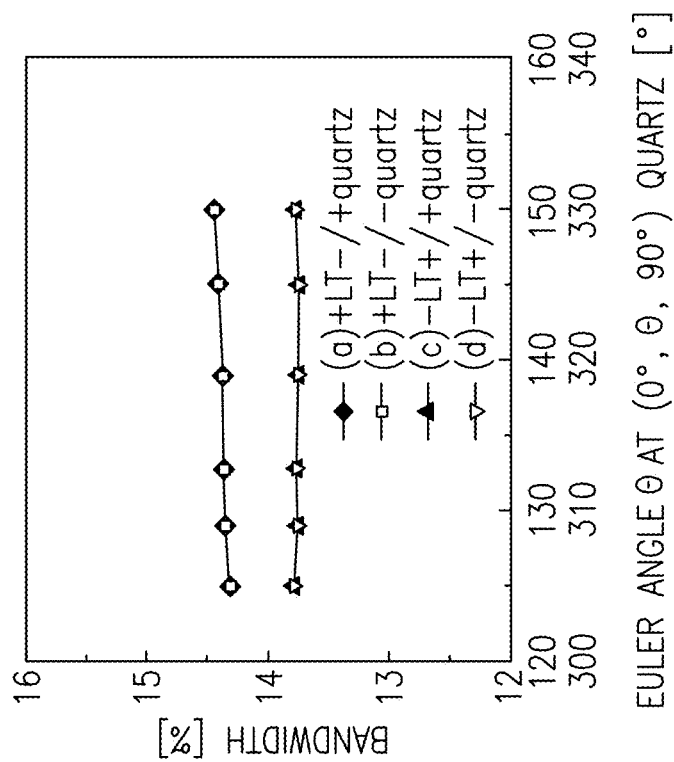

For example, (+) and (−) surfaces of a 25°-rotated Y-plate X-propagation LN ((0°, 115°, 0°) and (0°, 295°, 0°) in Euler angle respectively), and (+) surface of a rotation 35° Y-plate 90° X-propagation to 60° Y-plate 90° X-propagation quartz ((0°, 125°, 90°) to (0°, 150°, 90°) in Euler angle) and the (−) surface of the same quartz ((0°, 305°, 90°) to (0°, 330°, 90°) in Euler angle respectively) were prepared. The frequency characteristics of the SAW resonators were obtained for the four combinations as shown in FIGS. 6A-6D. The bandwidths and impedance ratios of the four structural combinations are shown in FIGS. 14A and 14B as a function of Euler angle θ of the quartz. Throughout the quartz of any Euler angles θ, a broader bandwidth and a greater impedance ratio are obtained from the structures of FIGS. 6A and 6B than those of FIGS. 6C and 6D. Other combinations of LN with quartz may also provide results similar to the corresponding combinations of LT with quartz as described herein.

Based at least in part on the foregoing examples, a combination of an LT or LN plate with a quartz substrate may provide a better characteristic in any orientation angles of the LT, LN or quartz by the structures of FIGS. 6A and 6B using the LT or LN plate whose surface bonded to the quartz substrate is a (−) surface.

When the polarization potential plane of a SAW resonator is perpendicular to a quartz surface (e.g., (90°, 90°, 90°) or (90°, −90°, 90°) plane in Euler angles), its quartz substrate does not have a (+) surface and a (−) surface with respect to the polarization direction. It is noted that the back side of the example (90°, 90°, 90°) plane is (90°, −90°, 90°) plane.

In the foregoing configuration of the quartz substrate, and referring to FIGS. 6E-6H and Table 2, the SAW resonators of FIG. 6E (+LT−/(90°, 90°, 90°) quartz) and FIG. 6F (+LT−/(90°, −90°, 90°) quartz) provide impedance ratios that are higher than those of the SAW resonators of FIG. 6G (−LT+/(90°, 90°, 90°) quartz) and FIG. 6H (−LT+/(90°, −90°, 90°) quartz). Accordingly, one can see that selecting a (−) or (+) plane of LT or LN for engagement with a quartz substrate is important for obtaining a high impedance ratio, whether or not the quartz substrate includes its own (−) and (+) plane.

Figure 15B:
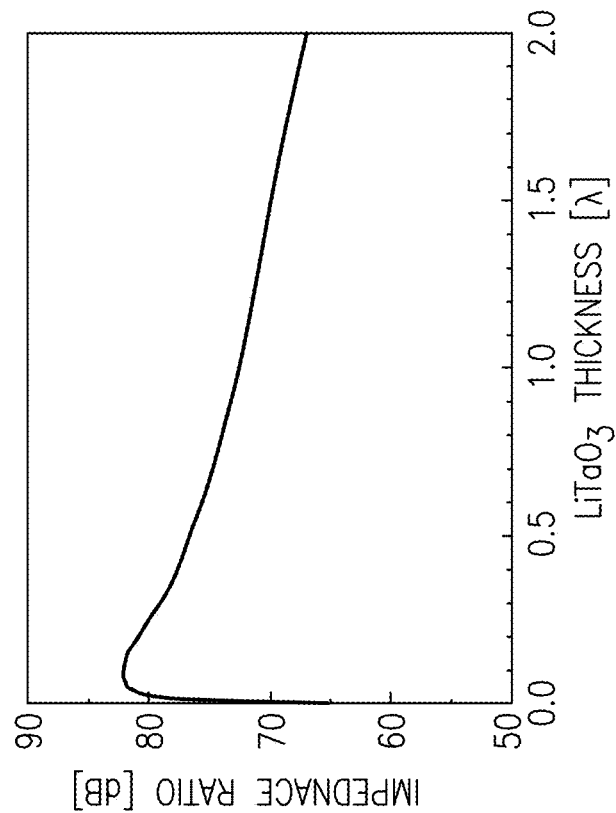
FIGS. 15A and 15B show an LT-thickness dependence of the bandwidth and the impedance ratio for an SAW resonator having a +20YXLT−/+42° 45'Y90X quartz structure.
Figure 15A:
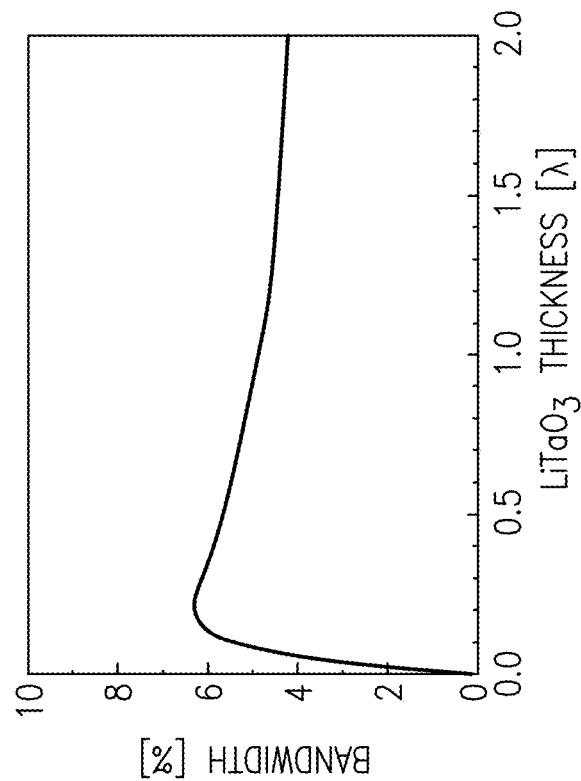

FIGS. 15A and 15B show a relationship between a thickness (in terms of wavelength λ) of a +20° YXLT−/+42° 45'Y90° X quartz structure and (a) a bandwidth and (b) an impedance ratio respectively. One can see that an impedance ratio of 70 dB or higher can be obtained in the LT thickness from 0.004λ to 1.5λ, and an impedance ratio of 73 dB or higher can be obtained from 0.006λ to 1λ. Accordingly, in order to obtain a greater impedance ratio, the thickness of the LT or LN may be 1.5λ or less, preferably 1λ or less.

It will be understood that one or more features of the present disclosure can be applied not only to an SAW resonator but also any SAW devices formed by combining an LT or LN layer with a quartz substrate.

Figure 16:
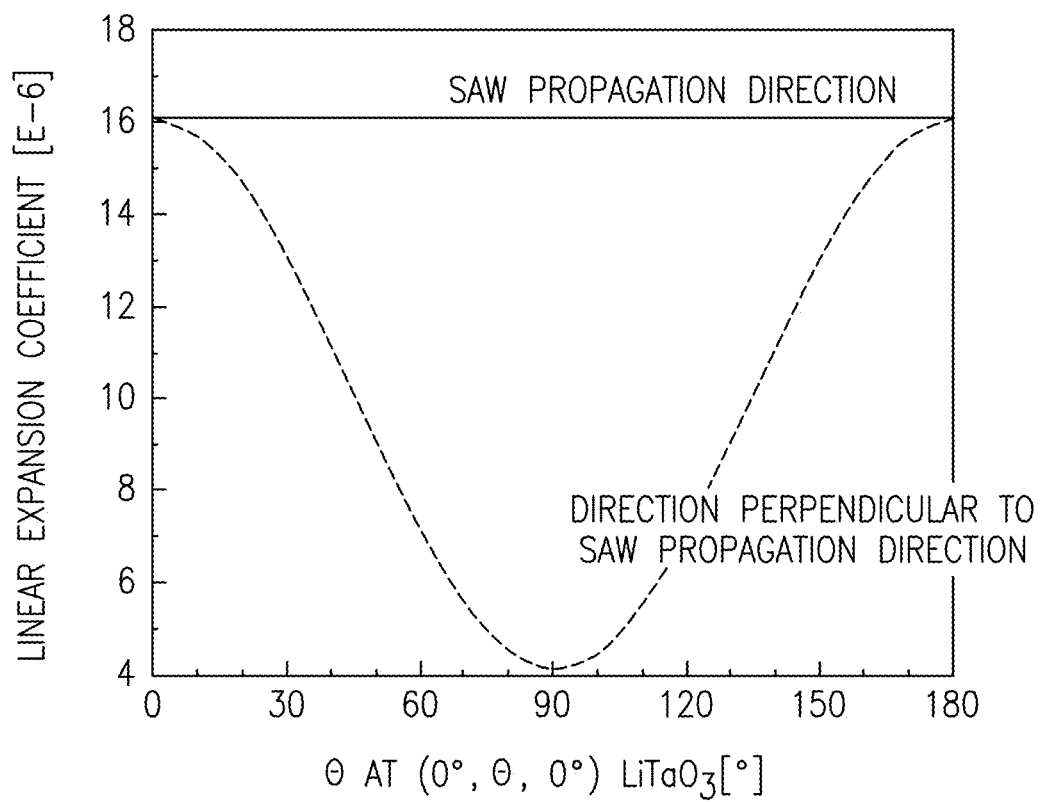
FIG. 16 shows a θ dependence of the linear expansion coefficients in the X-direction (SAW propagation direction) and the Y-direction (direction 90-degree angled to the SAW propagation direction) of a (0°, θ, 0°) LT.
Figure 17:
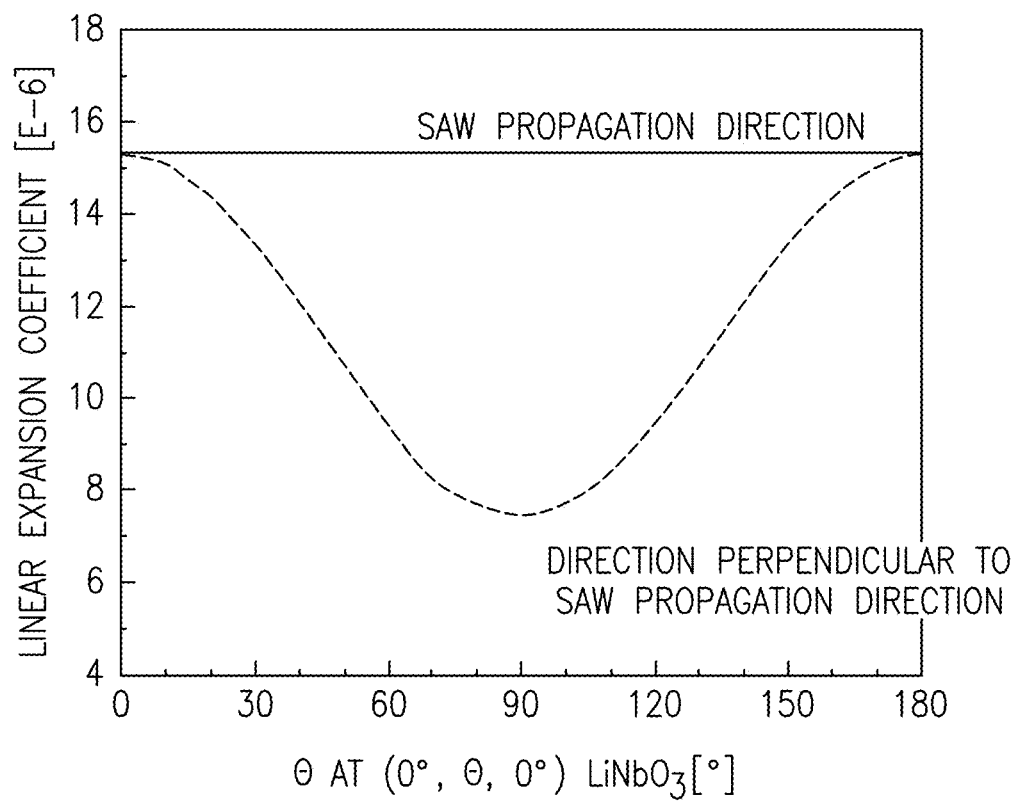
FIG. 17 shows a θ dependence of the linear expansion coefficient in the X-direction (SAW propagation direction)

FIGS. 16 and 17 show a θ dependence of a substrate on linear expansion coefficients in the X-direction (SAW propagation direction) and the Y-direction (direction 90-degree angled to the SAW propagation direction) for a (0°, θ, 0°) LT and a (0°, θ, 0°) LN respectively. For both of the LT and the LN, the linear expansion coefficient of the X-direction is greater than that of the Y-direction. For both of the LT and the LN, the difference of the linear expansion coefficients between the X-direction and the Y-direction is greater in the vicinity of θ=90°. It is noted that the linear expansion coefficient associated with (φ, θ, ψ) is essentially the same as that of (φ, θ+180°, ψ); thus, in the context of linear expansion coefficient, (φ, θ+180°, ψ) can be referred to herein as (φ, θ, ψ).

FIGS. 18, 19 and 20 show a θ dependence of linear expansion coefficients in the X-direction and the Y-direction of a substrate for a (0°, θ, 0°) quartz, a (0°, θ, 45°) quartz, and a (0°, θ, 90°) quartz respectively. As shown in FIG. 18 for the (0°, θ, 0°) quartz, the linear expansion coefficient of the X-direction is greater than that of the Y-direction. However, as shown in FIG. 19 for the (0°, θ, 45°) quartz, the linear expansion coefficients of the both directions are substantially identical, and as shown in FIG. 20 for the (0°, θ, 90°) quartz, the linear expansion coefficient of the Y-direction is greater than that of the X-direction.

FIGS. 21, 22 and 23 show a ψ dependence of linear expansion coefficients in the X-direction and the Y-direction of a substrate for a (0°, 126°, ψ) quartz, a (0°, 132° 45', ψ) quartz, and a (0°, 145°, ψ) quartz respectively. For any substrates at 0≤ψ<45° and 135°≤ψ≤180°, the linear expansion coefficient of the X-direction is greater than that of Y-direction; for ψ=45° and 135°, the linear expansion coefficients of the both directions are substantially identical; and for 45°≤ψ<135°, the linear expansion coefficient of the X-direction is less than that of the Y-direction.

In some embodiments, (0°, 280°-330°, 0°) (which provides the same linear expansion coefficient as (0°, 100°-150°, 0°)) can be used for the LT layer in view of a suitable coupling coefficient. Any combinations of these layers with a (0°, θ, 0°) quartz layer may allow the X-direction linear expansion coefficient to be greater than the Y-direction linear expansion coefficient and thus an expansion due to heat is greater in the X-direction at any orientation angle. Therefore, the LT layer is not likely to suffer from a thermal crack at any orientation angle. The difference of the X-direction linear expansion coefficient between the both layers is approximately 15%; however, if the difference is permitted even in the Y-direction, the Y-direction linear expansion coefficient for the LT orientation angle (0°, 120°-150°, 0°) may be approximately $7.10 \times 10^{-6}$ to $13.10 \times 10^{-6}$, whereas the Y-direction linear expansion coefficient for the quartz orientation angles (0°, 10°-80°, 0°) and (0°, 100°-170°, 0°) is approximately $7.48 \times 10^{-6}$ to $13.52 \times 10^{-6}$. Accordingly, the quartz orientation angle may allow the linear expansion coefficients of the both layers to be substantially identical.

In some embodiments, (0°, 265°-336°, 0°) (which provides the same linear expansion coefficient as (0°, 85°-156°, 0°)) can be used for the LN, and its combination with the (0°, θ, 0°) quartz may allow the X-direction linear expansion coefficient to be greater than the Y-direction linear expansion coefficient for the both layers such that a heat expansion in the X-direction can be greater at any orientation angle. The Y-direction linear expansion coefficient of the LN orientation angle (0°, 85°-156°, 0°) (which is equivalent to (0°, 265°-336°, 0°) in terms of linear expansion coefficient) is approximately $7.5 \times 10^{-6}$ to $14.00 \times 10^{-6}$, whereas the Y-direction linear expansion coefficient of the quartz (0°, 5°-85°, 0°) and (0°, 95°-175°, 0°) is approximately $7.48 \times 10^{-6}$ to $13.71 \times 10^{-6}$. Accordingly, the linear expansion coefficients of the LN and the quartz can be substantially identical for the orientation angle.

The magnitude relationship of the X-direction and Y-direction linear expansion coefficients is reversed between the (0°, θ, 0°) LT shown in FIG. 16 and the (0°, θ, 90°) quartz shown in FIG. 20, and thus a bonding condition of the LT and the quartz may be difficult to find. However, it may be preferable to use an orientation allowing the difference between the expansion coefficient of the (0°, 280°-330°, 0°) LT, which is a commonly used orientation by itself, and that of the quartz to be as small as possible. Such an orientation (0°, 280°-330°, 0°) LT has an X-direction linear expansion coefficient of approximately $16.1 \times 10^{-6}$, and its +/-40% linear expansion coefficient ranges from approximately $9.66 \times 10^{-6}$ to $22.96 \times 10^{-6}$; and thus the quartz orientation angle that allows the X-direction linear expansion coefficient of the quartz to be within the range may be (0°, 0°-54°, 90°) and (0°, 126°-180°, 90°). On the other hand, for the Y-direction, the linear expansion coefficient of the above-described orientation LT ranges from approximately $4.46 \times 10^{-6}$ to $13.1 \times 10^{-6}$, and its +/-40% linear expansion coefficient ranges from approximately $6.24 \times 10^{-6}$ to $18.34 \times 10^{-6}$; and thus the quartz orientation angle to satisfy these coefficients may be (0°, 0°-180°, 90°). To that end, for the example orientation (0°, 100°-150°, 0°) LT, a quartz orientation angle that allows the linear expansion coefficient difference between the LT and the quartz in the X-direction and the Y-direction to be within +/-40% may be (0°, 0°-54°, 90°) and (0°, 126°-180°, 90°).

The magnitude relationship of the X-direction and Y-direction linear expansion coefficients are reversed between the (0°, θ, 0°) LN shown in FIG. 17 and the (0°, θ, 90°) quartz shown in FIG. 20; however, it may be preferable to use an orientation allowing the difference between the expansion coefficient of the (0°, 85°-156°, 0°) LN, which is commonly used orientation by itself, and that of the quartz to be as small as possible. As shown in FIG. 17, the X-direction linear expansion coefficient of the (0°, 85°-156°, 0°) LN is approximately $15.4 \times 10^{-6}$, and its +/-40% X-direction linear expansion coefficient is approximately $9.24 \times 10^{-6}$ to $21.56 \times 10^{-6}$. Accordingly, the quartz corresponding to the coefficients has orientations of (0°, 0°-58°, 90°) and (0°, 122°-180°, 90°) as derived from FIG. 20. On the other hand, the Y-direction linear expansion coefficient of the same orientation LN ranges from approximately $7.62 \times 10^{-6}$ to $14.08 \times 10^{-6}$, the Y-direction linear expansion coefficient of the (0°, 0°-180°, 90°) quartz is approximately $13.71 \times 10^{-6}$, and the linear expansion coefficient of any orientations can be approximate to that of the above-described orientation LN. Therefore, the quartz orientation satisfying the difference of linear expansion coefficients between the (0°, 85°-156°, 0°) LN and the (0°, θ, 90°) quartz in the X-direction and the Y-direction within +/-40% can be (0°, 0°-58°, 90°) and (0°, 122°-180°, 90°).

Referring to FIGS. 21, 22 and 23, the X-direction and Y-direction linear expansion coefficients of the (0°, θ, ψ) quartz are substantially identical when ψ=45° and 135°, whereas the linear expansion coefficient of the X-direction is greater than that of Y-direction when 0≤ψ<45° and $135° \leq \psi \leq 180°$. The same applies to other θ. Therefore, the (0°, 0°-180°, 0°-45°) and (0°, 0°-180°, 135°-180°) quartz has a linear expansion coefficient of the X-direction greater than that of the Y-direction similar to the above-described LT and LN, and thus a desirable orientation angle for bonding. Further, as shown in FIGS. 21, 22 and 23, the X-direction and Y-direction linear expansion coefficients at $\psi=30°$ to 45° is within +/−7% with respect to the X-direction and Y-direction linear expansion coefficients at $\psi=45°$, and the magnitude relationship of the X-direction and Y-direction linear expansion coefficients is reversed between $\psi=30°$ to 45° and $\psi=45°$ to 60°; however, still be within +/−7% and a sufficient bond strength can be obtained even in the (0°, 0°-180°, 30°-60°) quartz. Similarly, the X-direction and Y-direction linear expansion coefficients at $\psi=120°$ to 150° is also within +/−7% with respect to the X-direction and Y-direction linear expansion coefficients at $\psi=135°$, and thus a sufficient bond strength can be obtained even in the (0°, 0°-180°, 120°-150°) quartz. Therefore, the (0°, 0°-180°, 30°-60° quartz and the (0°, 0°-180°, 120°-150°) quartz have an orientation angle suitable for bonding to the LT or LN, and preferably, the (0°, 0°-180°, 0°-45°) and (0°, 0°-180°, 135°-180°) quartz is a more suitable orientation angle.

FIGS. 24A-24C show an example process that can be utilized to manufacture a SAW resonator having one or more features as described herein. FIGS. 25A-25E show another example process that can be utilized to manufacture a SAW resonator having one or more features as described herein. In both examples, an LT material is utilized as a piezoelectric; however, it will be understood that other materials, including an LN material, may be utilized.

In the first example, FIG. 24A shows that in some embodiments, a manufacturing process can include a process step where an assembly 132 of a relatively thick LT plate 130 and a quartz plate 112 is formed or provided. In some embodiments, the relatively thick LT plate and the quartz plate can be cleaned and activated on their respective mirror surface sides, and the surfaces can be pressed to be bonded. Optionally or alternatively, bonding can be performed by using a thin film made of silicon (Si) and the like between the two plates.

FIG. 24B shows a process step where the thickness of the relatively thick LT plate 130 is reduced to a thinner LT plate 134, so as to form an assembly 136. In some embodiments, such a thinning process step can be achieved by, for example, polishing process such as a mechanical polishing process, a chemical mechanical process, etc. In FIG. 24B, the thinner LT plate 134 is shown to include a first surface that engages with the quartz plate 112 (e.g., by bonding), and a second surface, opposite from the first surface, resulting from the thinning process step. In some embodiments, the thinning process step can be performed to provide a desired thickness of the thinner LT plate in a range of, for example, 0.3 to 1 μm.

FIG. 24C shows a process step where an electrode 102 is formed on the second surface of the LT plate 134, so as to form an assembly 138. As described herein, such an electrode can include an interdigitized arrangement of fingers 122a, 122b.

In some embodiments, some or all of the process steps associated with FIGS. 24A-24C can be implemented for an individual unit to produce a single unit of the assembly 138, be implemented for a plurality of individual units to produce a plurality of respective single units of assemblies 138, or be implemented while a plurality units are attached in an array format (e.g., wafer format) followed by singulation to produce a plurality of singulated units of assemblies 138.

Figure 25A:
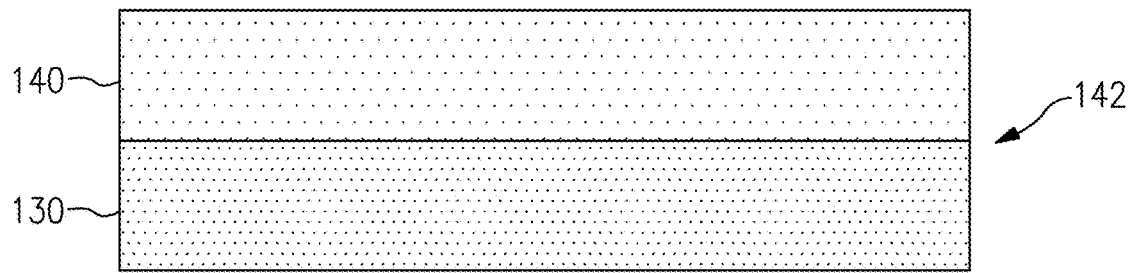

In the second example, FIG. 25A shows that in some embodiments, a manufacturing process can include a process step where an assembly 142 of a relatively thick LT plate 130 and a handling substrate (e.g., silicon substrate) 140 is formed or provided. In some embodiments, the relatively thick LT plate and the silicon (Si) substrate can be cleaned and activated on their respective mirror surface sides, and the mirror surface sides of the relatively thick LT plate and the Si substrate can be directly bonded while pressed in vacuum.

Figure 25B:
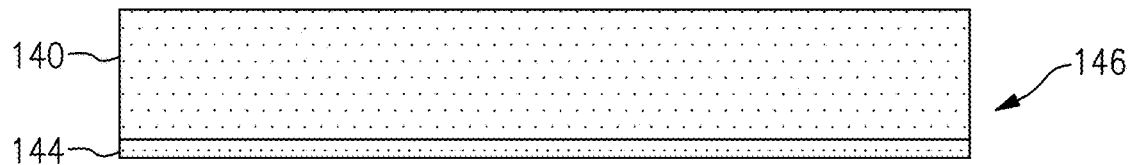

FIG. 25B shows a process step where the thickness of the relatively thick LT plate 130 is reduced to a thinner LT plate 144, so as to form an assembly 146. In some embodiments, such a thinning process step can be achieved by, for example, polishing process such as a mechanical polishing process, a chemical mechanical process, etc. In FIG. 25B, the thinner LT plate 144 is shown to include a first surface resulting from the thinning process step, and a second surface, opposite from the first surface, attached to the handling substrate 140. In some embodiments, the thinning process step can be performed to provide a desired thickness of the thinner LT plate in a range of, for example, 0.3 to 1 μm.

Figure 25C:
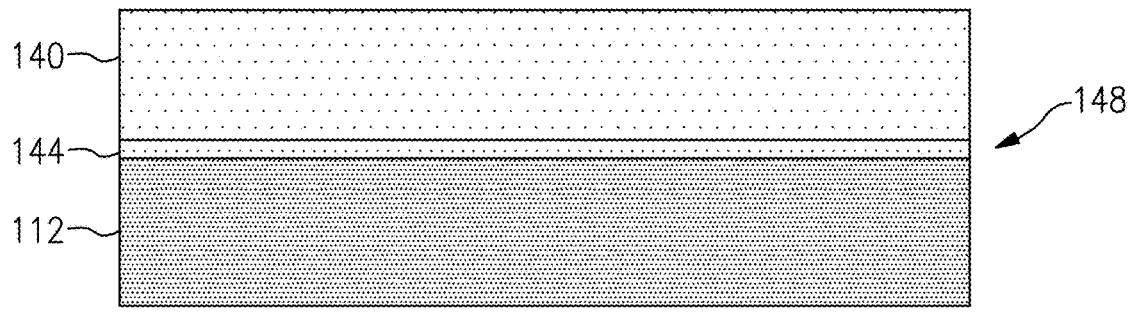

FIG. 25C shows a process step where the first surface of the LT plate 144 is attached to a quartz plate 112, so as to form an assembly 148. In some embodiments, the first surface of the LT plate 144 can be attached (e.g., bonded) directly to the quartz plate 112. In some embodiments, the relatively thick LT plate and the quartz plate can be cleaned and activated on their respective mirror surface sides, and the surfaces can be pressed to be bonded. In some embodiments, the LT plate 144 can be bonded to the quartz plate 112 so as to provide a surface combination as described herein in reference to Tables 1 and 2, such as the surface combination +LT−/+quartz− or +LT−/−quartz+, or a surface combination +LT−/quartz.

Figure 25D:
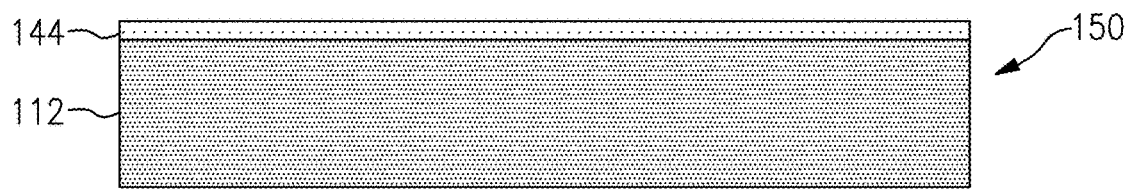

FIG. 25D shows a process step where the handling substrate (140 in FIG. 25C) is removed so as to partially or fully expose the LT plate 144, so as to form an assembly 150. In some embodiments, such removal of the handling substrate (such as a silicon substrate) can be achieved by, for example, an etching process (e.g., plasma etching process). In some embodiments, the LT plate 144 in the assembly 150 of FIG. 25D may or may not be substantially the same as the LT plate 144 in the assembly 148 of FIG. 25C. For the purpose of description, it will be understood that the exposed surface resulting from the removal of the handling substrate is similar to the second surface of the LT plate 144 described in reference to FIG. 25B.

Figure 25E:
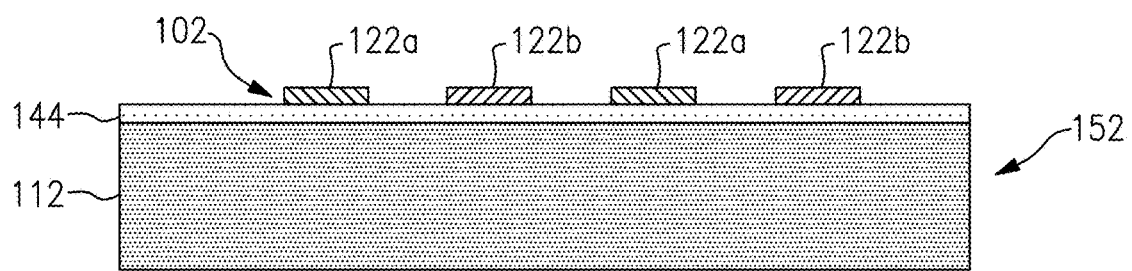

FIG. 25E shows a process step where an electrode 102 is formed on the second surface of the LT plate 144, so as to form an assembly 152. As described herein, such an electrode can include an interdigitized arrangement of fingers 122a, 122b.

In some embodiments, some or all of the process steps associated with FIGS. 25A-25E can be implemented for an individual unit to produce a single unit of the assembly 152, be implemented for a plurality of individual units to produce a plurality of respective single units of assemblies 152, or be implemented while a plurality units are attached in an array format (e.g., wafer format) followed by singulation to produce a plurality of singulated units of assemblies 152.

It is noted that in the example manufacturing process of FIGS. 24A-24C, the bond strength between the quartz or glass plate and the LT or LN plate can be relatively weak and, during the polishing process, the LT plate may be peeled, cracked or the like, to be often prevented from being polished to a desired thickness. FIG. 26A shows an example of damage after a heat treatment of 20 hours at 200° C. for enhancing the bond strength (in FIG. 24A). FIG. 26B shows an example of an LT partially peeled due to a weak bond strength when the LT is polished to 5 μm.

A method for measuring the strength of two bonded substrates and also an equation of a bond strength γ may be found in Tong, Q., Goesele, U., and Society, E. (1999) Semiconductor Wafer Bonding: Science and Technology, John Wiley & Sons, Inc., New York. The bond force between quartz and LT is typically 1 Joul/m$^2$ or less in various bonding techniques. Similarly, the bonding force between LT and glass, LN and quartz, or LN and glass is typically 1 Joul/m$^2$ or less.

On the other hand, the bond force between silicon, sapphire and the like other than quartz and LT or LN is as high as 30 Joul/m$^2$ or more, regardless of whether or not a heat treatment is performed when or after bonding; and therefore the LT or LN plate likely will not be peeled or cracked even if polished to 0.3 μm. Accordingly, the example manufacturing process of FIGS. 25A-25E can be preferable in many manufacturing applications.

Referring to FIGS. 25A-25E, when the mirror surface sides of LT and Si are directly bonded while pressed in vacuum, the bond strength γ was 43 Joul/m$^2$. Then, the LT plate can be polished to an example thickness of 0.3 μm without peeling or damage. An example of a polished LT surface is shown in FIG. 27A. Next, the LT polished surface and the quartz surface can be cleaned, activated, and pressed to provide bonding. Subsequently, Si can be etched using, for example, plasma etching. FIG. 27B shows a photograph of the resulting assembly (150 in FIG. 25D) from the LT side. The bond strength γ between the LT plate and the quartz plate was 0.97 Joul/m$^2$, which can provide sufficient strength for further processing to produce a SAW resonator, because no polishing is necessary after the step of bonding LT and quartz.

The resulting assembly (150 in FIG. 25D) can be used and an IDT electrode can be formed on the thinned LT plate to manufacture a SAW resonator having one or more features as described herein.

In some embodiments, and as described herein in reference to FIGS. 6A-6H and Tables 1 and 2, bonding strength between LT and quartz can vary depending on crystal orientations of LT and/or quartz. For example, it is noted that among the eight configurations listed in Tables 1 and 2, the configuration of FIG. 6A (+LT−/+quartz−) provides the highest bonding strength (2γ=2.2 Joul/m$^2$, or γ=1.1 Joul/m$^2$).

Accordingly, it will be understood that in some embodiments, the example process of FIGS. 24A-24C can be implemented with, for example, +LT−/+quartz− (FIG. 6A) or +LT−/−quartz+ (FIG. 6B) when a higher bonding strength between LT and quartz is desired. Preferably, the +LT−/+ quartz− configuration of FIG. 6A can be utilized if the highest bonding strength between LT and quartz is desired.

It will also be understood that in some embodiments, the example process of FIGS. 25A-25E can also be implemented with, for example, +LT−/+quartz− (FIG. 6A) or +LT−/−quartz+ (FIG. 6B) when a higher bonding strength between LT and quartz is desired. Preferably, the +LT−/+ quartz− configuration of FIG. 6A can be utilized if the highest bonding strength between LT and quartz is desired. However, since the example process of FIGS. 25A-25E utilizes a handling substrate (such as a silicon substrate) as described herein, it will be understood that in some embodiments, the process of FIGS. 25A-25E can be implemented with any of the configurations of FIGS. 6A-6H and Tables 1 and 2.

An example frequency characteristic of the resulting SAW resonator is shown in FIG. 28. An impedance ratio of 82 dB, which is greater by 2 dB than the example characteristic shown in FIG. 5, was obtained. Further, the LT plate having a 0.3 μm thickness can be used to realize a 2.3 GHz high-frequency SAW resonator.

Accordingly, by utilizing the technique described in reference to FIGS. 25A-25E, a piezoelectric plate such as LT or LN plate can be polished to approximately 0.3 μm such that a SAW device of 2 GHz or greater having high Q, high impedance, and better temperature characteristic can be realized. Further, in some embodiments, a bond film may be provided between the piezoelectric thin plate and the quartz. Examples of such a configuration can be found in International Publication No. WO2018/097016 which is expressly incorporated by reference in its entirely.

FIG. 29 shows that in some embodiments, multiple units of SAW resonators can be fabricated while in an array form. For example, a wafer 200 can include an array of units 100', and such units can be processed through a number of process steps while joined together. For example, in some embodiments, all of the process steps of FIGS. 24A-24C can be achieved while an array of such units are joined together as a wafer having different layers (e.g., quartz layer 112 and LT layer 130, 134). In another example, all of the process steps of FIGS. 25A-25E can be achieved while an array of such units are joined together as a wafer having different layers (e.g., handle layer 140, LT layer 130, 144 and quartz layer 112).

Upon completion of process steps in the foregoing wafer format, the array of units 100' can be singulated to provide multiple SAW resonators 100. FIG. 29 depicts one of such SAW resonators 100. In the example of FIG. 29, the singulated SAW resonator 100 is shown to include an electrode 102 formed on a piezoelectric layer 104 such as an LT or LN layer. Such an piezoelectric layer and the corresponding quartz layer can be configured as described herein to provide desirable features. It will be understood that in some embodiments, another electrode can be provided, as well as one or more reflectors, on the piezoelectric layer.

FIG. 30 shows that in some embodiments, a SAW resonator 100 having or more features as described herein can be implemented as a part of a packaged device 300. Such a packaged device can include a packaging substrate 302 configured to receive and support one or more components, including the SAW resonator 100.

FIG. 31 shows that in some embodiments, the SAW resonator based packaged device 300 of FIG. 30 can be a packaged filter device 300. Such a filter device can include a packaging substrate 302 suitable for receiving and supporting a SAW resonator 100 configured to provide a filtering functionality such as RF filtering functionality.

FIG. 32 shows that in some embodiments, a radio-frequency (RF) module 400 can include an assembly 406 of one or more RF filters. Such filter(s) can be SAW resonator based filter(s) 100, packaged filter(s) 300, or some combination thereof. In some embodiments, the RF module 400 of FIG. 32 can also include, for example, an RF integrated circuit (RFIC) 404, and an antenna switch module (ASM) 408. Such a module can be, for example, a front-end module configured to support wireless operations. In some embodiments, some of all of the foregoing components can be mounted on and supported by a packaging substrate 402.

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

FIG. 33 depicts an example wireless device 500 having one or more advantageous features described herein. In the context of a module having one or more features as described herein, such a module can be generally depicted by a dashed box 400, and can be implemented as, for example, a front-end module (FEM). In such an example, one or more SAW filters as described herein can be included in, for example, an assembly of filters such as duplexers 526.

Referring to FIG. 33, power amplifiers (PAs) 520 can receive their respective RF signals from a transceiver 510 that can be configured and operated in known manners to generate RF signals to be amplified and transmitted, and to process received signals. The transceiver 510 is shown to interact with a baseband sub-system 408 that is configured to provide conversion between data and/or voice signals suitable for a user and RF signals suitable for the transceiver 510. The transceiver 510 can also be in communication with a power management component 506 that is configured to manage power for the operation of the wireless device 500. Such power management can also control operations of the baseband sub-system 508 and the module 400.

The baseband sub-system 508 is shown to be connected to a user interface 502 to facilitate various input and output of voice and/or data provided to and received from the user. The baseband sub-system 508 can also be connected to a memory 504 that is configured to store data and/or instructions to facilitate the operation of the wireless device, and/or to provide storage of information for the user.

In the example wireless device 500, outputs of the PAs 520 are shown to be routed to their respective duplexers 526. Such amplified and filtered signals can be routed to an antenna 516 through an antenna switch 514 for transmission. In some embodiments, the duplexers 526 can allow transmit and receive operations to be performed simultaneously using a common antenna (e.g., 516). In FIG. 33, received signals are shown to be routed to "Rx" paths (not shown) that can include, for example, a low-noise amplifier (LNA).

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. Claims and their equivalents are intended to cover such forms or modifications as would fall within the scope and spirit of the disclosure.

What is claimed is:

1. An acoustic wave device comprising:
a quartz substrate including a first surface;
a piezoelectric plate formed from $LiTaO_3$ or $LiNbO_3$ and including a first surface configured to support a surface acoustic wave and a second surface in direct engagement with the first surface of the quartz substrate, the second surface being a minus surface resulting from crystal structure orientation of the piezoelectric plate; and
an interdigital transducer electrode formed on the first surface of the piezoelectric plate and configured to provide transducer functionality associated with the surface acoustic wave.

2. The acoustic wave device of claim 1 wherein the crystal structure orientation of the piezoelectric plate includes Euler angles (0°, 90°<θ<270°, 0°).

3. The acoustic wave device of claim 2 wherein the first surface of the quartz substrate is a plus surface resulting from crystal structure orientation of the quartz substrate.

4. The acoustic wave device of claim 3 wherein the crystal structure orientation of the quartz substrate includes Euler angles (φ, 90°<θ<270°, ψ), the angle φ having a value in a range of 0°≤φ<180°, the angle ψ having a value in a range of 0°≤ψ<180°.

5. The acoustic wave device of claim 2 wherein the first surface of the quartz substrate is a minus surface resulting from crystal structure orientation of the quartz substrate.

6. The acoustic wave device of claim 5 wherein the crystal structure orientation of the quartz substrate includes Euler angles (φ, −90°<θ<90°, ψ), the angle φ having a value in a range of 0°≤φ<180°, the angle ψ having a value in a range of 0°≤ψ<180°.

7. The acoustic wave device of claim 2 wherein the first surface of the quartz substrate is an unpolarized surface resulting from crystal structure orientation of the quartz substrate.

8. The acoustic wave device of claim 7 wherein the crystal structure orientation of the quartz substrate includes Euler angles (φ, 90°, ψ) or (φ, −90°, ψ), the angle φ having a value in a range of 0°≤φ<180°, the angle ψ having a value in a range of 0°≤ψ<180°.

9. The acoustic wave device of claim 8 wherein the angle φ has a value of 90° and the angle ψ has a value of 90°.

10. The acoustic wave device of claim 1 wherein the piezoelectric plate is formed from LiTaO$_3$ and the quartz substrate includes Euler angles (0°, 10°-80°, 0°), (0°, 100°-170°, 0°), (0°, 190°-260°, 0°) or (0°, 280°-350°, 0°).

11. The acoustic wave device of claim 1 wherein the piezoelectric plate is formed from LiNbO$_3$ and the quartz substrate includes Euler angles (0°, 5°-85°, 0°), (0°, 95°-175°, 0°), (0°, 185°-265°, 0°) or (0°, 275°-355°, 0°).

12. The acoustic wave device of claim 1 wherein the piezoelectric plate is formed from LiTaO$_3$ and the quartz substrate includes Euler angles (0°, 5°-53°, 90°), (0°, 127°-175°, 90°), (0°, 185°-233°, 90°) or (0°, 307°-355°, 90°).

13. The acoustic wave device of claim 1 wherein the piezoelectric plate is formed from LiNbO$_3$ and the quartz substrate includes Euler angles (0°, 0°-52°, 90°), (0°, 126°-180°, 90°), (0°, 180°-232°, 90°) or (0°, 306°-360°, 90°).

14. The acoustic wave device of claim 1 wherein the piezoelectric plate is formed from LiTaO$_3$ or LiNbO$_3$ and the quartz substrate includes Euler angles (0°, 0°-360°, 0°-60°) or (0°, 0°-360°, 120°-180°).

15. The acoustic wave device of claim 14 wherein the piezoelectric plate is formed from LiTaO$_3$ or LiNbO$_3$ and the quartz substrate includes Euler angles (0°, 0°-360°, 0°-45°) or (0°, 0°-360°, 135°-180°).

16. The acoustic wave device of claim 1 further comprising first and second reflectors implemented on the first surface of the piezoelectric plate and positioned on first and second sides of the interdigital transducer electrode.

17. The acoustic wave device of claim 1 wherein thickness of the piezoelectric plate is in a range of 0.04λ to 1.5λ, the quantity λ being wavelength of the surface acoustic wave.

18. A method for fabricating an acoustic wave device, the method comprising:
    forming or providing a quartz substrate having a first surface;
    forming or providing a piezoelectric plate with LiTaO$_3$ or LiNbO$_3$ to include a first surface configured to support a surface acoustic wave and a second surface being a minus surface resulting from crystal structure orientation of the piezoelectric plate; and
    coupling the piezoelectric plate with the quartz substrate such that the minus surface of the piezoelectric plate directly engages the first surface of the quartz substrate.

19. A radio-frequency filter comprising:
    an input node for receiving a signal;
    an output node for providing a filtered signal; and
    an acoustic wave device implemented to be electrically between the input node and the output node to generate the filtered signal, the acoustic wave device including a quartz substrate with a first surface, and a piezoelectric plate formed from LiTaO$_3$ or LiNbO$_3$ and having a first surface configured to support a surface acoustic wave and a second surface in direct engagement with the first surface of the quartz substrate, the second surface being a minus surface resulting from crystal structure orientation of the piezoelectric plate.

20. The radio-frequency filter of claim 19 further comprising first and second interdigital transducer electrodes formed on the first surface of the piezoelectric plate, the first interdigital transducer electrode electrically connected to the input node and the second interdigital transducer electrode electrically connected to the output node.

* * * * *